(12) United States Patent
Kwon et al.

(10) Patent No.: US 11,681,217 B2
(45) Date of Patent: Jun. 20, 2023

(54) PHOTOSENSITIVE RESIN COMPOSITION, PHOTOSENSITIVE RESIN LAYER USING THE SAME AND COLOR FILTER

(71) Applicant: SAMSUNG SDI CO., LTD., Yongin-si (KR)

(72) Inventors: Jihye Kwon, Suwon-si (KR); Sunghoon Park, Suwon-si (KR); Jungsun Lee, Suwon-si (KR); Juho Jung, Suwon-si (KR); Gyuseok Han, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 958 days.

(21) Appl. No.: 16/533,936

(22) Filed: Aug. 7, 2019

(65) Prior Publication Data

US 2020/0142301 A1 May 7, 2020

(30) Foreign Application Priority Data

Nov. 6, 2018 (KR) ........................ 10-2018-0135401

(51) Int. Cl.
| | | |
|---|---|---|
| *G03F 7/00* | (2006.01) | |
| *G03F 7/004* | (2006.01) | |
| *C09B 47/18* | (2006.01) | |
| *C09B 57/00* | (2006.01) | |
| *G02F 1/13357* | (2006.01) | |
| *G02F 1/1335* | (2006.01) | |

(52) U.S. Cl.
CPC ............ *G03F 7/0007* (2013.01); *C09B 47/18* (2013.01); *C09B 57/007* (2013.01); *G03F 7/0045* (2013.01); *G02F 1/133514* (2013.01); *G02F 1/133617* (2013.01)

(58) Field of Classification Search
CPC ................. G03F 7/0007; G03F 7/0045; G02F 1/133514; G02F 1/133617
See application file for complete search history.

(56) References Cited

U.S. PATENT DOCUMENTS

| | | | |
|---|---|---|---|
| 9,182,667 B2 * | 11/2015 | Moon ....................... | G03F 7/105 |
| 10,564,320 B2 * | 2/2020 | Jeong ...................... | C09B 47/04 |
| 10,858,519 B2 * | 12/2020 | Haraguchi ............. | G02B 5/281 |
| 11,091,645 B2 * | 8/2021 | Seo ...................... | C09B 67/0097 |
| 11,518,888 B2 * | 12/2022 | Okada ...................... | C08K 3/24 |
| 2014/0175344 A1 | 6/2014 | Ryu et al. | |
| 2014/0234758 A1 | 8/2014 | Kim et al. | |
| 2014/0264202 A1 * | 9/2014 | Nagaya ............... | C09B 67/0034 252/587 |
| 2014/0349220 A1 * | 11/2014 | Moon ................... | G03F 7/0007 430/7 |
| 2016/0090501 A1 | 3/2016 | Hyung et al. | |
| 2018/0335547 A1 * | 11/2018 | Jeong ...................... | G02B 5/223 |
| 2019/0256713 A1 | 8/2019 | Jeong et al. | |
| 2019/0375914 A1 * | 12/2019 | Samejima ............ | C08K 5/0041 |
| 2019/0382587 A1 * | 12/2019 | Seo ......................... | G03F 7/033 |
| 2020/0308099 A1 | 10/2020 | Jeong et al. | |
| 2021/0189137 A1 * | 6/2021 | Okada .................. | C08L 101/00 |
| 2021/0355327 A1 * | 11/2021 | Seo ........................ | G02B 5/223 |

FOREIGN PATENT DOCUMENTS

| | | | | |
|---|---|---|---|---|
| CN | 107793327 A | 3/2018 | | |
| JP | H06-019168 A | 1/1994 | | |
| JP | H06-289633 A | 10/1994 | | |
| JP | H06-289635 A | 10/1994 | | |
| JP | 2000-242010 A | 9/2000 | | |
| JP | 2014-028950 A | 2/2014 | | |
| JP | 2016-053716 A | 4/2016 | | |
| JP | 2016-117858 A | 6/2016 | | |
| JP | 2017-173812 A | 9/2017 | | |
| JP | 2019-530765 A | 10/2019 | | |
| JP | 2019-532145 A | 11/2019 | | |
| JP | 2019-532918 A | 11/2019 | | |
| KR | 10-2015-0021860 A | 3/2015 | | |
| KR | 10-2015-0034626 A | 4/2015 | | |
| KR | 10-2015-0145010 A | 12/2015 | | |
| KR | 10-2016-0127110 A | 11/2016 | | |
| KR | 10-2017-0016954 A | 2/2017 | | |
| KR | 10-2017-0046524 A | 5/2017 | | |
| KR | 10-2017-0142096 A | 12/2017 | | |
| KR | 10-2018-0033814 A | 4/2018 | | |
| KR | 10-2018-0035077 A | 4/2018 | | |
| KR | 10-2019-0054408 A | 5/2019 | | |
| KR | 2019054408 A * | 5/2019 | ........... | C07C 219/32 |
| KR | 10-2019-0078311 A | 7/2019 | | |
| KR | 2019078311 A * | 7/2019 | ............. | C09B 57/00 |
| TW | 2018-00497 A | 1/2018 | | |
| TW | 2018-13953 A | 4/2018 | | |
| TW | 2018-14006 A | 4/2018 | | |
| WO | WO 2018-043829 A1 | 3/2018 | | |
| WO | WO 2018-056546 A1 | 3/2018 | | |

OTHER PUBLICATIONS

E. Arunkumar et al., 127 Journal of the American Chemical Society, 3288-3289 (2005) (Year: 2005).*
Japanese Office action dated Nov. 10, 2020.
Taiwanese Office action and Search repert dated Mar. 23, 2020.
Xiao, et al. "Research Progress in Phenolic Photosensitive Material", China Academic Journal, vol. 41, No. 9 (Sum.257) Sep. 2013, pp. 101-106.
Hossy et al. "Phototoxic Assessment of a Sunscreen Formulation and its excipients", Journal of Photochemistry & Photobiology, B: Biology, Accepted Manuscript, Apr. 10, 2017.
Chinese Search Report dated Jan. 11, 2023.

* cited by examiner

*Primary Examiner* — Alexander R Pagano
(74) *Attorney, Agent, or Firm* — Lee IP Law, P.C.

(57) ABSTRACT

A photosensitive resin composition, a photosensitive resin layer, and a color filter, the composition including a colorant including a first green dye having a core-shell structure and a second green dye in a weight ratio of about 1:9 to about 7:3; a binder resin; a photopolymerizable compound; a photopolymerization initiator; and a solvent.

19 Claims, 1 Drawing Sheet

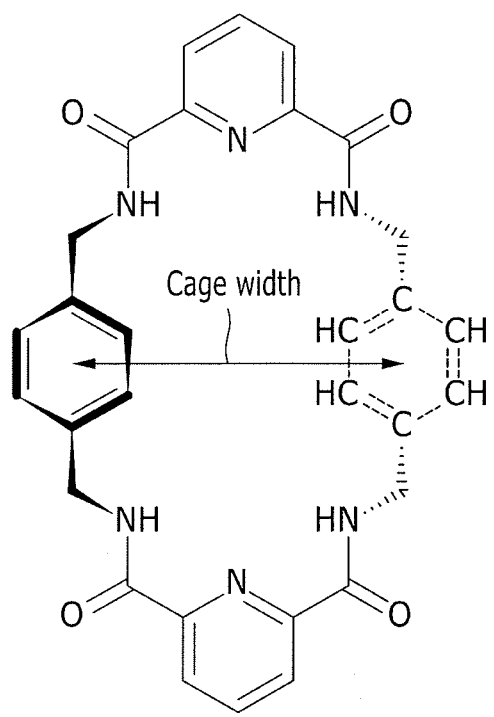

PHOTOSENSITIVE RESIN COMPOSITION, PHOTOSENSITIVE RESIN LAYER USING THE SAME AND COLOR FILTER

CROSS-REFERENCE TO RELATED APPLICATION

Korean Patent Application No. 10-2018-0135401, filed on Nov. 6, 2018, in the Korean Intellectual Property Office, and entitled: "Photosensitive Resin Composition, Photosensitive Resin Layer Using the Same and Color Filter," is incorporated by reference herein in its entirety.

BACKGROUND

1. Field

Embodiments relate to a photosensitive resin composition, a photosensitive resin layer using the same, and a color filter.

2. Description of the Related Art

A liquid crystal display device may have an advantage of lightness, thinness, low cost, low power consumption for operation, and improved adherence to an integrated circuit and may be used for a laptop computer, a monitor, and a TV screen. The liquid crystal display device may include a lower substrate on which a black matrix, a color filter, and an ITO pixel electrode are formed, and an upper substrate on which an active circuit portion including a liquid crystal layer, a thin film transistor, and a capacitor layer and an ITO pixel electrode are formed. Color filters may be formed in a pixel region by sequentially stacking a plurality of color filters (e.g., formed of three primary colors such as red (R), green (G), and blue (B) in a predetermined order to form each pixel, and a black matrix layer may be provided in a predetermined pattern on a transparent substrate to form a boundary between the pixels.

SUMMARY

The embodiments may be realized by providing a photosensitive resin composition including a colorant that includes a first green dye having a core-shell structure in which the core is represented by Chemical Formula 1, and a second green dye represented by Chemical Formula 2, a weight ratio of the first green dye to the second green dye in the colorant being about 1:9 to about 7:3; a binder resin; a photopolymerizable compound; a photopolymerization initiator; and a solvent,

[Chemical Formula 1]

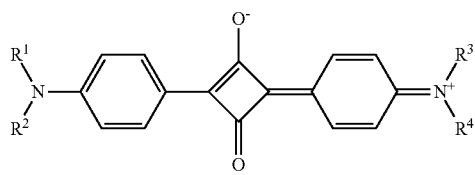

[Chemical Formula 2]

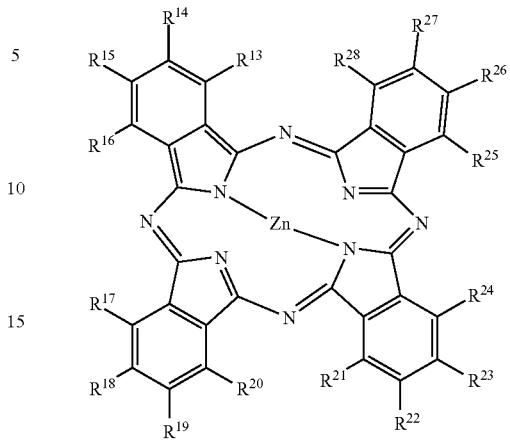

wherein, in Chemical Formula 1 and Chemical Formula 2, $R^1$ to $R^4$ are each independently a substituted or unsubstituted C1 to C20 alkyl group, a substituted or unsubstituted C3 to C20 cycloalkyl group, or a substituted or unsubstituted C6 to C20 aryl group, provided that at least one of $R^1$ to $R^4$ is a substituted C1 to C20 alkyl group, a substituted C3 to C20 cycloalkyl group, or a substituted C6 to C20 aryl group that is substituted with a substituted or unsubstituted acrylate group, and $R^{13}$ to $R^{28}$ are each independently a hydrogen atom, a halogen atom, a substituted or unsubstituted C1 to C20 alkyl group, a substituted or unsubstituted C3 to C20 alkoxy group, a substituted or unsubstituted C6 to C20 aryl group, or a substituted or unsubstituted C6 to C20 aryloxy group.

The embodiments may be realized by providing a photosensitive resin layer manufactured using the photosensitive resin composition according to an embodiment.

The embodiments may be realized by providing a color filter including the photosensitive resin layer according to an embodiment.

BRIEF DESCRIPTION OF THE DRAWING

Features will become apparent to those of skill in the art by describing in detail exemplary embodiments with reference to the attached drawing in which:

The FIGURE illustrates a view showing a cage width of a shell represented by Chemical Formula 8-1.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may be present. In addition, it will also be understood that when a layer is referred to as being "between" two layers, it can be the only layer between the two layers, or one or more intervening layers may also be present.

As used herein, when specific definition is not otherwise provided, "substituted" may refer to replacement of at least one hydrogen atom of a compound by a substituent of a halogen atom (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, or a combination thereof.

As used herein, when specific definition is not otherwise provided, a "heterocycloalkyl group", a "heterocycloalkenyl group", a "heterocycloalkynyl group," and a "heterocycloalkylene group" may refer to each cyclic compound of cycloalkyl, cycloalkenyl, cycloalkynyl, and cycloalkylene including at least one heteroatom of N, O, S, or P.

As used herein, when specific definition is not otherwise provided, "(meth)acrylate" may refer to both "acrylate" and "methacrylate".

As used herein, when specific definition is not otherwise provided, the term "combination" may refer to mixing or copolymerization.

As used herein, when a definition is not otherwise provided, hydrogen is bonded at the position when a chemical bond is not drawn where supposed to be given.

As used herein, when specific definition is not otherwise provided, "*" indicate chiral carbon.

As used herein, when specific definition is not otherwise provided, "**" refers to a linking point with the same or different atom or chemical formula.

A photosensitive resin composition according to an embodiment may include, e.g., (A) a colorant including a first green dye and a second green dye. The first green dye may have a core-shell structure in which the core is represented by Chemical Formula 1. The second green dye may be represented by Chemical Formula 2. The first green dye and the second green dye may be included in the colorant in a weight ratio of about 1:9 to about 7:3. The photosensitive resin composition according to an embodiment may also include, e.g., (B) a binder resin; (C) a photopolymerizable compound; (D) a photopolymerization initiator; and (E) a solvent.

[Chemical Formula 1]

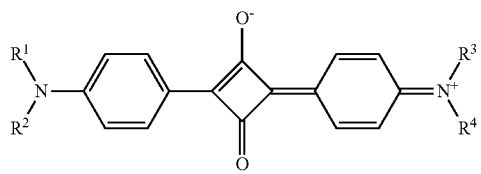

[Chemical Formula 2]

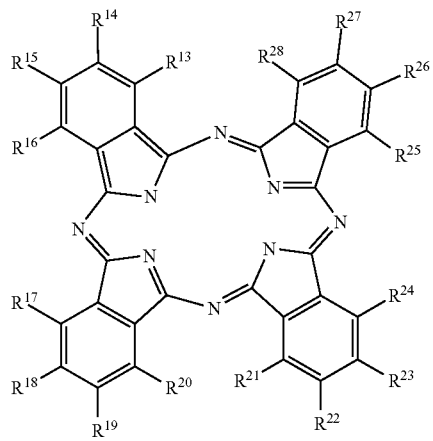

In Chemical Formula 1, $R^1$ to $R^4$ may each independently be or include, e.g., a substituted or unsubstituted C1 to C20 alkyl group, a substituted or unsubstituted C3 to C20 cycloalkyl group, or a substituted or unsubstituted C6 to C20 aryl group. In an implementation, at least one of $R^1$ to $R^4$ may include a substituted or unsubstituted acrylate group (e.g., at a terminal end thereof). For example, at least one of $R^1$ to $R^4$ may be a substituted C1 to C20 alkyl group, a substituted C3 to C20 cycloalkyl group, or a substituted C6 to C20 aryl group that is substituted with a substituted or unsubstituted acrylate group. For example, at least one of $R^1$ to $R^4$ may include a pendent substituted or unsubstituted acrylate group.

In Chemical Formula 2, $R^{13}$ to $R^{28}$ may each independently be or include, e.g., a hydrogen atom, a halogen atom, a substituted or unsubstituted C1 to C20 alkyl group, a substituted or unsubstituted C3 to C20 alkoxy group, a substituted or unsubstituted C6 to C20 aryl group, or a substituted or unsubstituted C6 to C20 aryloxy group.

(A) Colorant

A colorant may be used when forming a high luminance color filter, and some color filters may be formed by using a pigment photosensitive resin composition. A pigment may have excellent processability but may be limited in terms of finely dispersing pigment particles having an influence on luminance improvement (as for the pigment-type photosensitive resin composition, when pigment particles of less than or equal to 50 nm are dispersed in order to increase luminance, the luminance may be a little improved, but a contrast ratio may be decreased due to particle agglomeration according to dispersion instability) and accordingly, may cause an ACC defect, which has recently been an issue in a LCD display.

A dye may be present in a monomolecular state and may have high luminance and high contrast ratio characteristics. Heat resistance and durability may be of concern when compared with the pigment. A dye may be weak about a process treatment solvent used in a LCD panel manufacturing process and a color change and/or luminance deterioration could possibly occur. Rather than completely replacing the pigment with the dye, a method of restricting an amount of the dye, applying an epoxy-based binder resin enhancing chemical resistance characteristics, or the like may be considered, but luminance may be a concern, and characteristics of the dye may not be fully realized.

A photosensitive resin composition for a color filter may be prepared by applying a phthalocyanine green dye or a squarylium green dye. When the phthalocyanine green dye alone is applied, about 1% to about 1.5% of transmittance may be obtained, compared with that of the pigment photosensitive resin composition, but higher transmittance than that may not be achieved. When the squarylium green dye alone is applied, about 3% to about 4% or higher transmittance may be obtained, compared with that of the pigment photosensitive resin composition, but luminance could deteriorate due to reduced heat resistance and chemical resistance in a color filter process.

The photosensitive resin composition according to an embodiment may use a colorant prepared by mixing a phthalocyanine dye and a squarylium dye in a predetermined weight ratio and thus may maintain high transmittance, high luminance, and a high contrast ratio characteristics and simultaneously, improve heat resistance and chemical resistance, compared with those of the pigment photosensitive resin composition. In an implementation, the squarylium dye may have a core-shell structure, and the core may be represented by Chemical Formula 1. In an implementation, the phthalocyanine dye may be represented by Chemical Formula 2. In an implementation, a (e.g., first) green dye having the core-shell structure and a (e.g., second) green dye represented by Chemical Formula 2 may be mixed in a weight ratio of, e.g., about 1:9 to about 7:3, and excellent color characteristics may be maintained, and simultaneously, high luminance and a high contrast ratio may be obtained. If the first green dye having the core-shell structure were to be included in a smaller mixing weight ratio than the weight ratio range above, high transmittance and high luminance characteristics may not be exhibited. If the first green dye having the core-shell structure were to be included in a larger mixing weight ratio than the weight ratio range above, chemical resistance could be deteriorated.

In an implementation, the first green dye having the core-shell structure and the second green dye represented by Chemical Formula 2 may be included in a weight ratio of, e.g., about 2:8 to about 5:5, about 3:7 to about 5:5, or about 3:7 to about 4:6.

In Chemical Formula 1, the acrylate group (e.g., of the acrylate-substituted one of $R^1$ to $R^4$) may form a direct bond with a chiral carbon of $R^1$ to $R^4$.

The first green dye having the core-shell structure may include a compound represented by Chemical Formula 1 as a core and may exhibit excellent green spectral characteristics and a high molar extinction coefficient. In addition, the acrylate group may form a direct bond with a chiral carbon, luminance may be improved and accordingly, may realize a color filter having high luminance and a high contrast ratio.

In an implementation, in Chemical Formula 1, at least one of $R^1$ to $R^4$ may be a group represented by Chemical Formula 3.

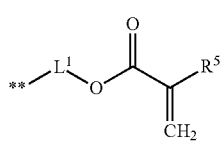

[Chemical Formula 3]

In Chemical Formula 3, $R^5$ may be, e.g., a hydrogen atom or a substituted or unsubstituted C1 to C10 alkyl group, and $L^1$ may be, e.g., a group represented by Chemical Formula 3-1 or Chemical Formula 3-2.

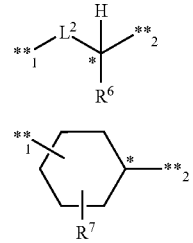

[Chemical Formula 3-1]

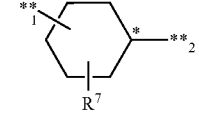

[Chemical Formula 3-2]

In Chemical Formula 3-1 and Chemical Formula 3-2, $L^2$ may be, e.g., a single bond or a substituted or unsubstituted C1 to C10 alkylene group, $R^6$ may be, e.g., a substituted or unsubstituted C1 to C10 alkyl group, $R^7$ may be, e.g., a hydrogen atom or a substituted or unsubstituted C1 to C10 alkyl group,

* indicates a chiral carbon,

1 indicates a linking point with  of Chemical Formula 3, and

**2 indicates a linking point with the oxygen atom of the ether group (e.g., the inline oxygen atom) of Chemical Formula 3.

In an implementation, in Chemical Formula 1, at least one of $R^1$ and $R^2$ may be a group represented by Chemical Formula 3 and at least one of $R^3$ and $R^4$ may be a group represented by Chemical Formula 3.

In an implementation, "$R^1$ or $R^2$" and "$R^3$ or $R^4$" may each independently be a group represented by Chemical Formula 4 or Chemical Formula 5.

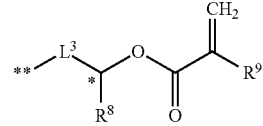

[Chemical Formula 4]

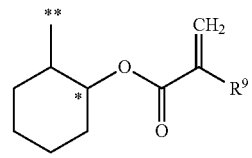

[Chemical Formula 5]

In Chemical Formula 4 and Chemical Formula 5, $L^3$ may be, e.g., a substituted or unsubstituted C1 to C10 alkylene group, $R^8$ may be, e.g., a substituted or unsubstituted C1 to C10 alkyl group, $R^9$ may be, e.g., a hydrogen atom or a substituted or unsubstituted C1 to C10 alkyl group, and

* indicates chiral carbon.

In an implementation, $R^1$ and $R^3$ may each independently be, e.g., a C6 to C20 aryl group substituted with a C1 to C10 alkyl group, and $R^2$ and $R^4$ may each independently be, e.g., a group represented by Chemical Formula 4 or Chemical Formula 5.

In an implementation, $R^1$ and $R^3$ may each independently be a C6 to C20 aryl group substituted with one to three C1 to C10 alkyl group.

In an implementation, $R^1$ and $R^3$ may each independently be a group represented by Chemical Formula 6-1 to Chemical Formula 6-3.

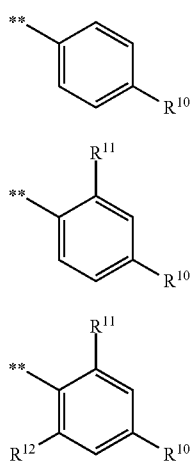

[Chemical Formula 6-1]

[Chemical Formula 6-2]

[Chemical Formula 6-3]

In Chemical Formula 6-1 to Chemical Formula 6-3, $R^{10}$ to $R^{12}$ may each independently be, e.g., an unsubstituted C1 to C10 alkyl group.

The first green dye having the core-shell structure may have the core represented by Chemical Formula 1, and the first green dye may have a solubility in a solvent (described below) of greater than or equal to about 5, e.g. about 5 to about 10. The solubility value may be obtained by an amount (g) of the dye dissolved in 100 g of the solvent. When the dye has the solubility within the range, compatibility and coloring properties with other components in the photosensitive resin composition, e.g., the below-described binder resin, photopolymerizable monomer, and/photopolymerization initiator may be secured, and precipitation of the dye may be reduced or prevented.

The first green dye having the core-shell structure may have the core represented by Chemical Formula 1, and the first green dye may have improved heat resistance. For example, a thermal decomposition temperature measured using a thermogravimetric analyzer (TGA) may be, e.g., greater than or equal to 200° C., or 200° C. to 300° C.

The core represented by Chemical Formula 1 may have three types of resonance structures as shown in the following diagram, but in the present disclosure, the core having only one of the resonance structures and represented by Chemical Formula 1 is shown for convenience. For example, the core represented by Chemical Formula 1 may have any one structure of the three resonance structures.

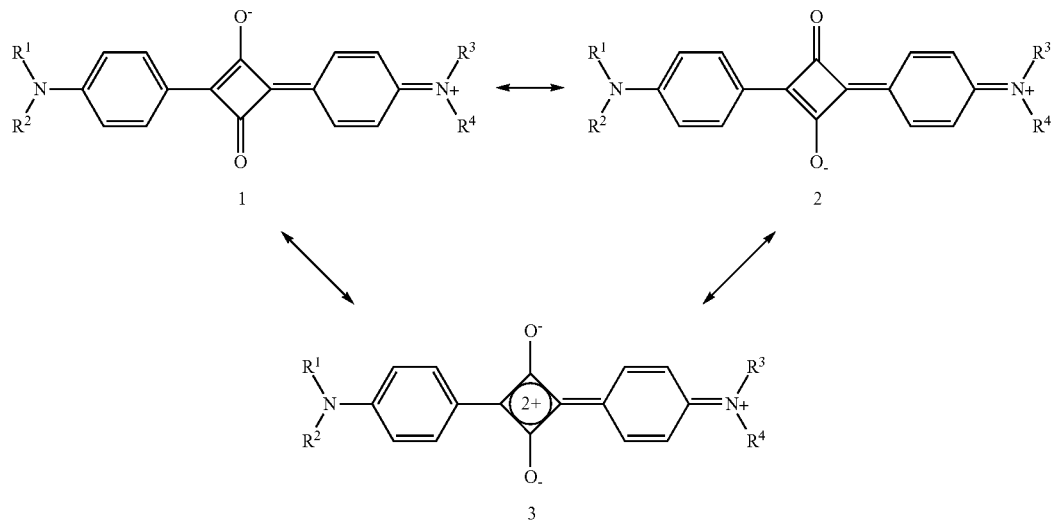

In an implementation, the core represented by Chemical Formula 1 may be represented by, e.g., one of Chemical Formula 1-1 to Chemical Formula 1-7.

[Chemical Formula 1-1]

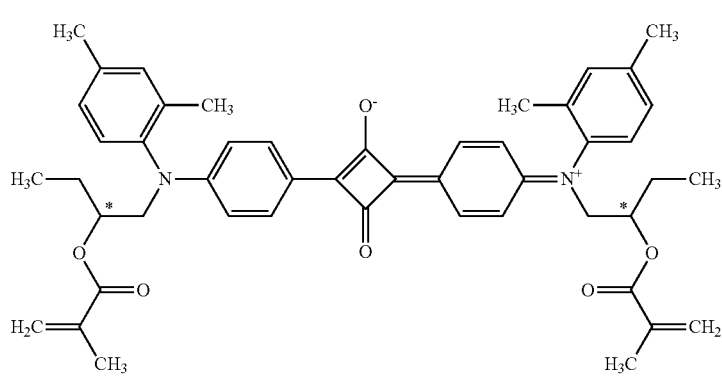

-continued
[Chemical Formula 1-2]
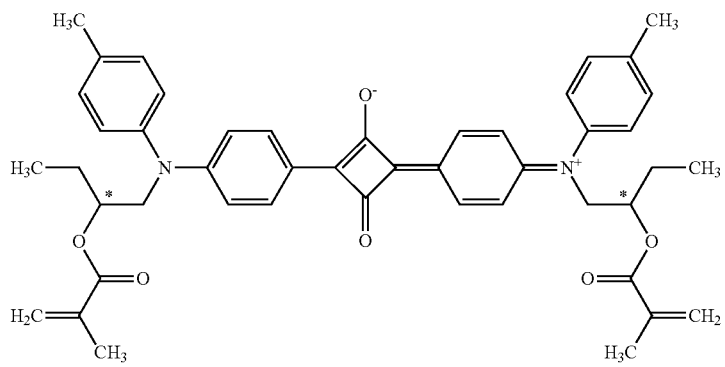
[Chemical Formula 1-3]
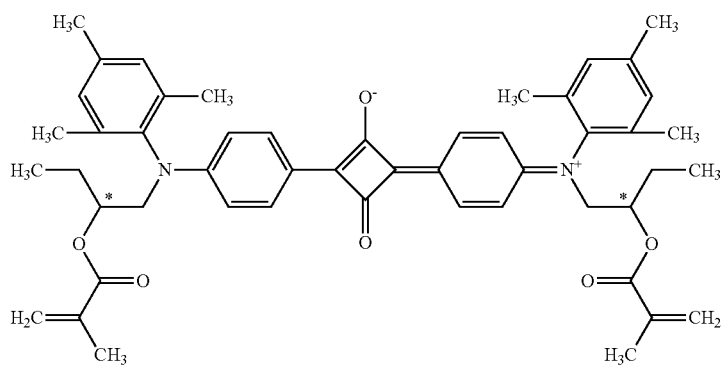
[Chemical Formula 1-4]
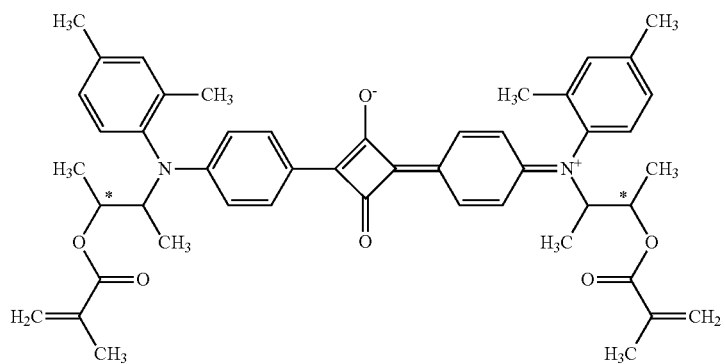
[Chemical Formula 1-5]
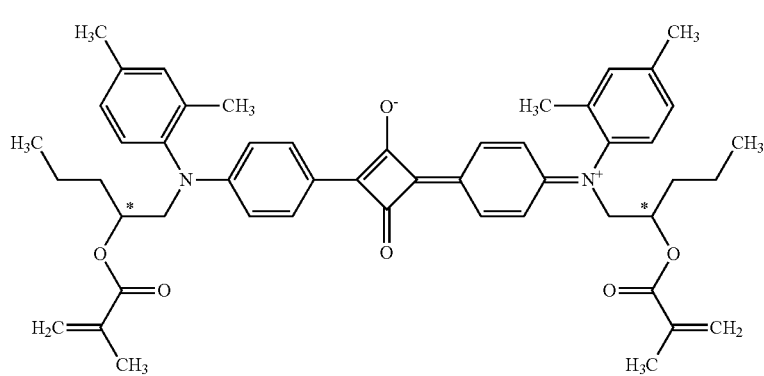

-continued

[Chemical Formula 1-6]

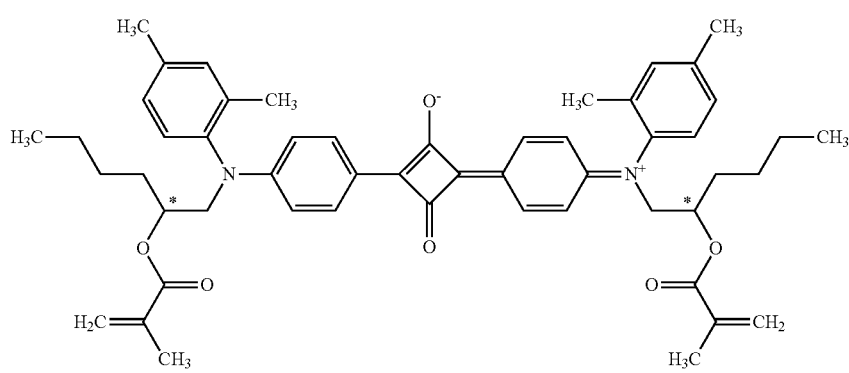

[Chemical Formula 1-7]

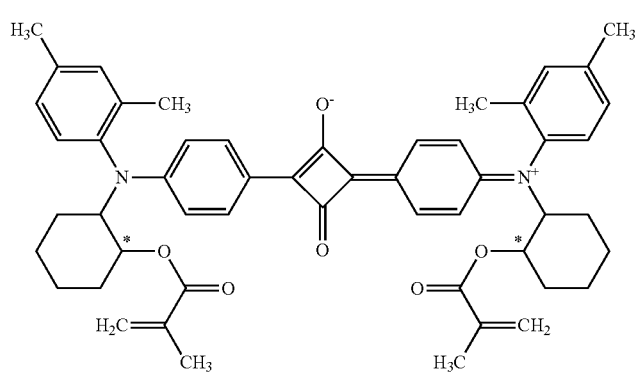

In an implementation, the shell may be a (e.g., relatively large or huge) cyclic compound, and the shell may surround the compound (e.g., core) represented by Chemical Formula 1 to form a coating layer (e.g., shell).

The compound represented by Chemical Formula 1 may be surrounded by the shell corresponding to a cyclic compound, e.g., the compound represented by Chemical Formula 1 may be present inside the (e.g., relatively large or huge) cycle, e.g., inside a ring formed by the cyclic structure of the shell, and durability of the core-shell dye may be improved and a color filter having high luminance and a high contrast ratio may be realized.

In an implementation, a length of the compound represented by Chemical Formula 1 included in the core or composed of the core may be, e.g., about 1 nm to about 3 nm, or about 1.5 nm to about 2 nm. When the compound represented by Chemical Formula 1 has a length within the range, the core-shell dye may have a structure in which a shell easily surrounds the core. For example, the compound represented by Chemical Formula 1 may have a length within the range, and may have a structure that the relatively large cyclic compound, e.g., the shell, surrounds the compound represented by Chemical Formula 1. If a compound having a length outside of the above-described range were to be used as a core, a structure in which the shell surrounds the core compound may not be obtained, and durability may not be improved.

The compound represented by Chemical Formula 1 (constituting the core) may have a maximum absorption peak at a wavelength of, e.g., about 530 nm to about 680 nm. The core-shell dye using the compound represented by Chemical Formula 1 having the spectral characteristics as a core may be used as a green dye and a photosensitive resin composition for a color filter having high luminance and high contrast ratio may be provided.

In an implementation, the shell surrounding the core represented by Chemical Formula 1 may be represented by, e.g., Chemical Formula 7 or Chemical Formula 8.

[Chemical Formula 7]

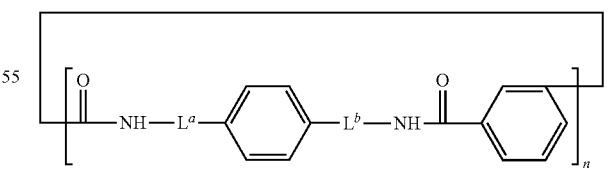

[Chemical Formula 8]

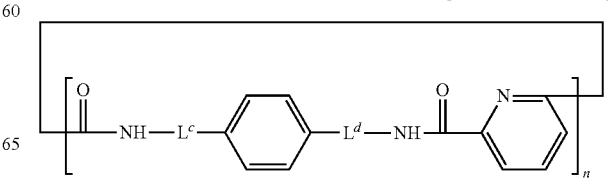

In Chemical Formula 7 and Chemical Formula 8, $L^a$ to $L^d$ may each independently be, e.g., a single bond or a substituted or unsubstituted C1 to C10 alkylene group, and n may be, e.g., an integer of 2 to 10.

In an implementation, in Chemical Formula 7 and Chemical Formula 8, $L^a$ to $L^d$ may each independently be, e.g., a substituted or unsubstituted C1 to C10 alkylene group. In this case, a structure having improved solubility where a shell surrounds the core represented by Chemical Formula 1 may be easily formed.

In an implementation, the core-shell first green dye may include a non-covalent bond, e.g., a hydrogen bond between an oxygen atom of the core represented by Chemical Formula 1 and a nitrogen atom of the shell represented by Chemical Formula 7 or Chemical Formula 8.

In an implementation, the shell may be, e.g., represented by Chemical Formula 7-1 or Chemical Formula 8-1.

[Chemical Formula 7-1]

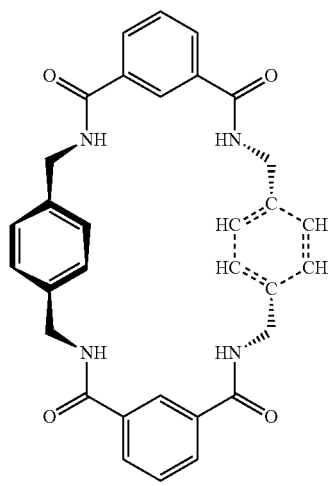

[Chemical Formula 8-1]

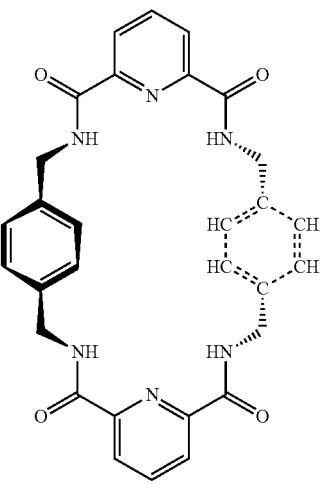

In an implementation, a cage width of the shell may be, e.g., about 6.5 Å to about 7.5 Å, and a volume of the shell may be, e.g., about 10 Å to about 16 Å. The cage width in this disclosure may refer to an internal distance of the shell, e.g., in a shell represented by Chemical Formula 7-1 or Chemical Formula 8-1, a distance between (e.g., centers of) two different phenylene groups to which both methylene groups are linked (See the FIGURE). When the shell has a cage width within the range, a core-shell dye having a structure surrounding the core represented by Chemical Formula 1 may be obtained, and a color filter having improved durability and high luminance may be realized when the core-shell dye is added to a photosensitive resin composition.

In an implementation, the core-shell first green dye may include the core represented by Chemical Formula 1 and the shell in a mole ratio of, e.g., about 1:1. When the core and shell are present within the mole ratio, a coating layer (shell) surrounding the core represented by Chemical Formula 1 may be formed well.

In an implementation, the core-shell first green dye may be represented by, e.g., one of Chemical Formulae 9 to 22.

[Chemical Formula 9]

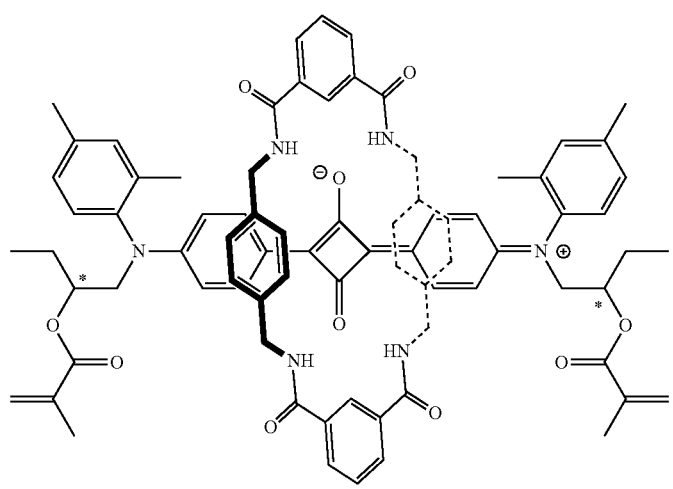

[Chemical Formula 10]
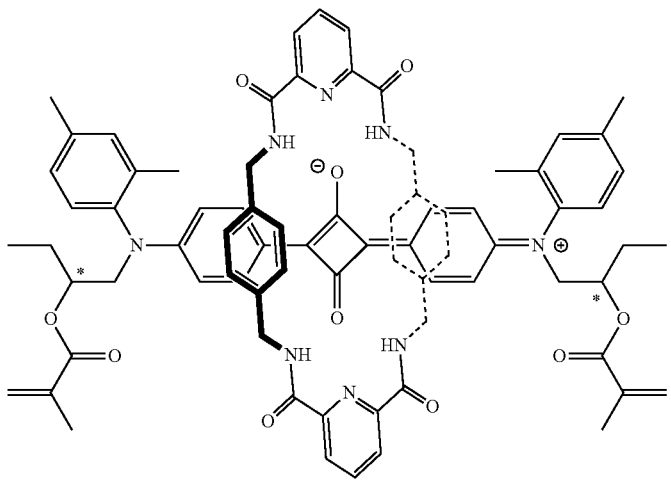
[Chemical Formula 11]
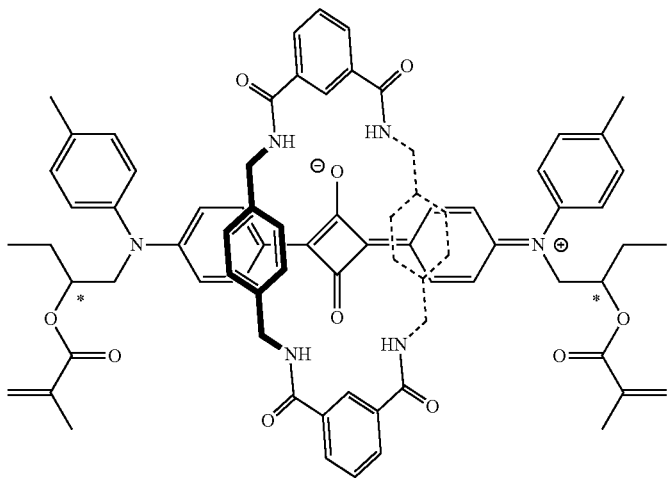
[Chemical Formula 12]
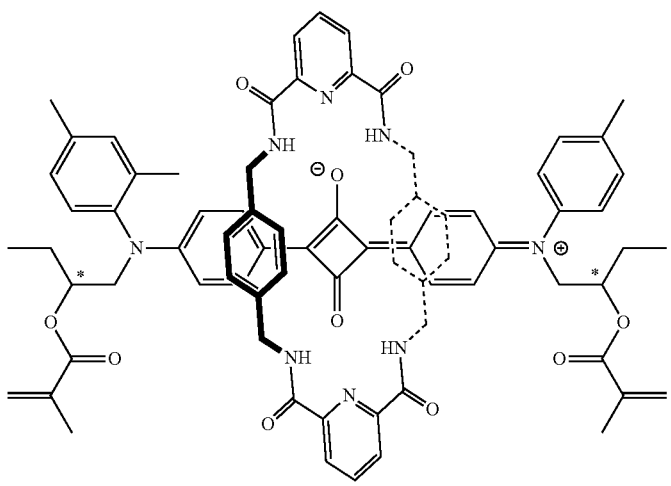

-continued
[Chemical Formula 13]
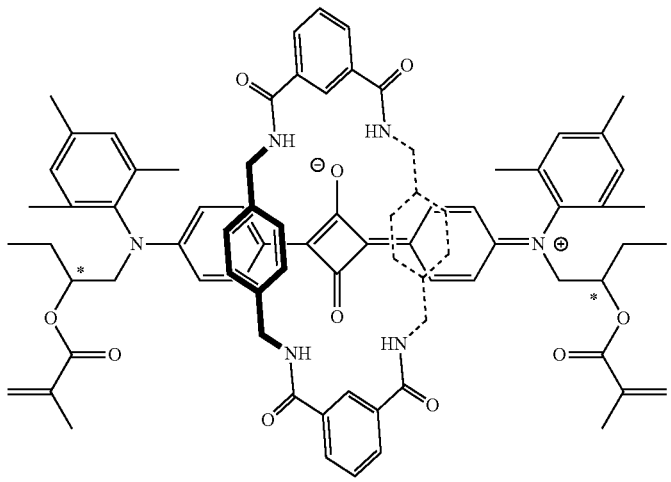
[Chemical Formula 14]
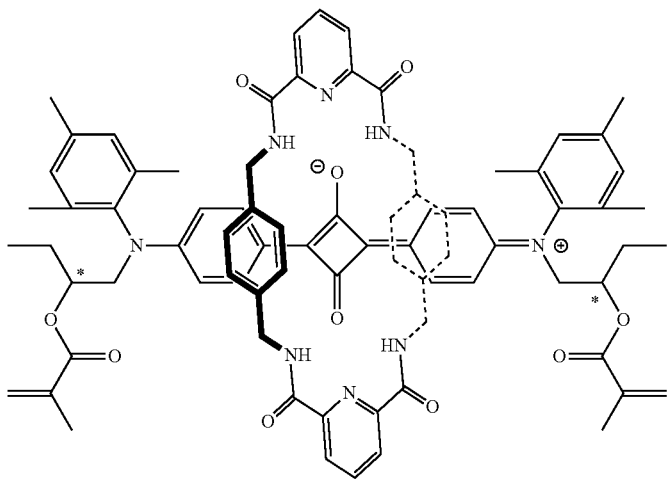
[Chemical Formula 15]
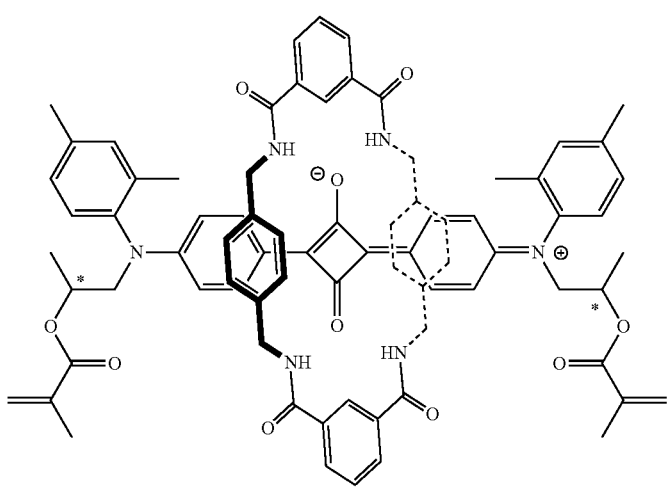

[Chemical Formula 16]
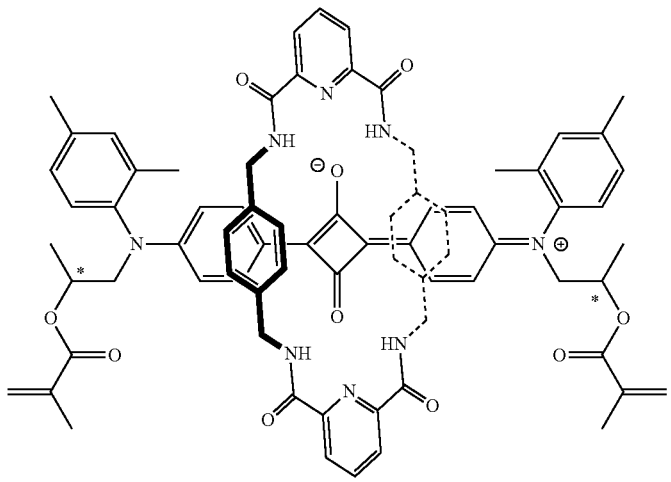
[Chemical Formula 17]
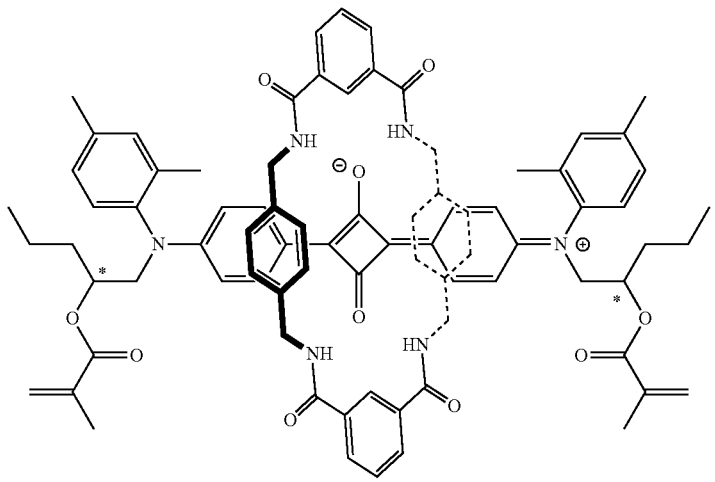
[Chemical Formula 18]
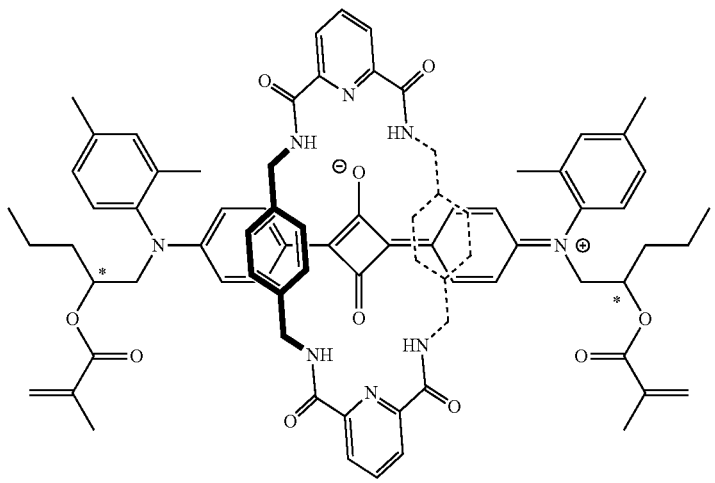

[Chemical Formula 19]
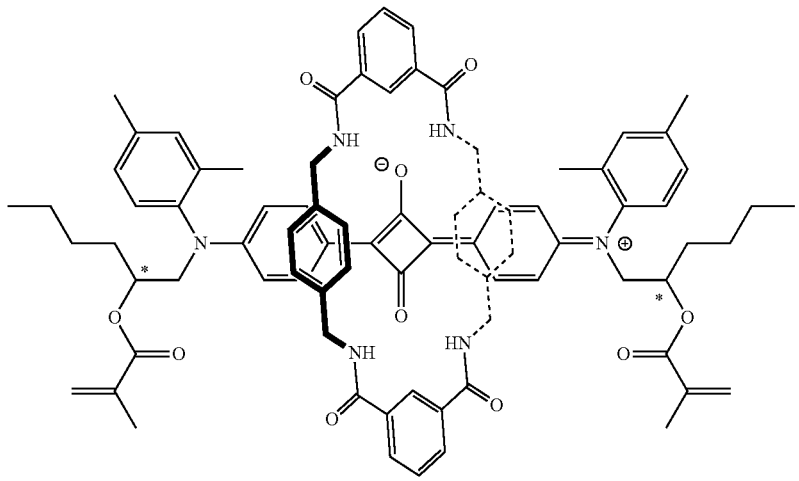
[Chemical Formula 20]
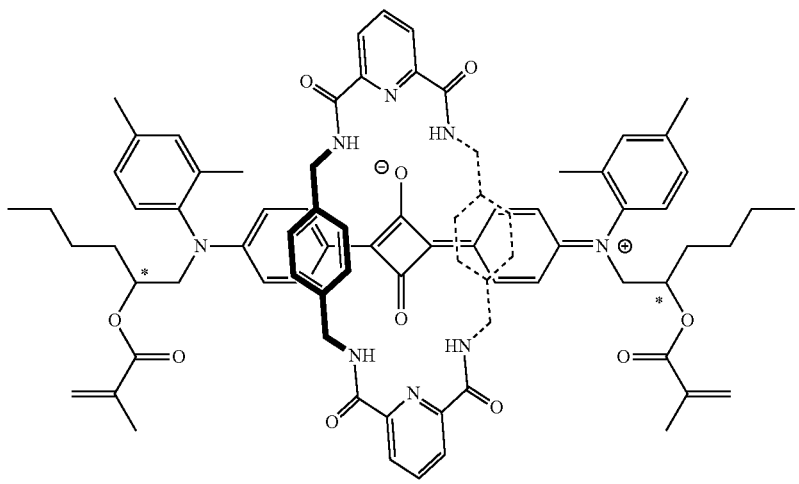
[Chemical Formula 21]
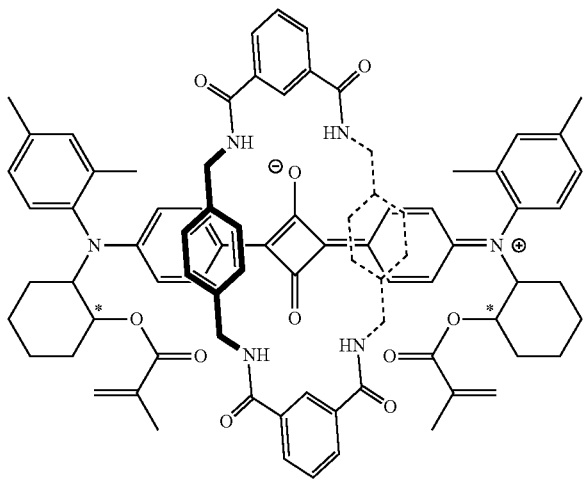

-continued

[Chemical Formula 22]

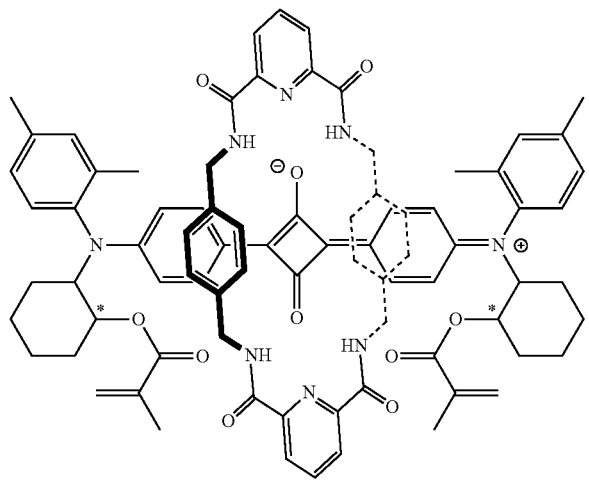

In an implementation, in the second green dye represented by Chemical Formula 2, at least one of $R^{13}$ to $R^{28}$ may be, e.g., a group represented by Chemical Formula 23.

[Chemical Formula 23]

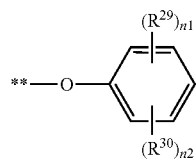

In Chemical Formula 23, $R^{29}$ and $R^{30}$ may each independently be, e.g., a halogen atom, and n1 and n2 may each independently be an integer of, e.g., 0 to 5. In an implementation, $1 \leq n1+n2 \leq 5$.

The second green dye represented by Chemical Formula 2 my have excellent green spectral characteristics and a high molar extinction coefficient. In an implementation, the second green dye represented by Chemical Formula 2 may include a substituent represented by Chemical Formula 23, which may help improve solubility in an organic solvent and may help improve luminance and contrast ratio when applied to a color filter.

In an implementation, the group represented by Chemical Formula 23 may be represented by, e.g., one of Chemical Formula 24-1 to Chemical Formula 24-4.

[Chemical Formula 24-1]

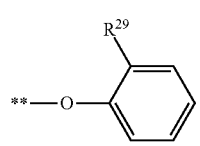

[Chemical Formula 24-2]

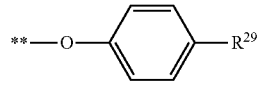

[Chemical Formula 24-3]

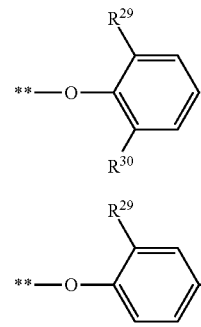

[Chemical Formula 24-4]

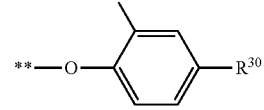

In Chemical Formulae 24-1 to 24-4, $R^{29}$ and $R^{30}$ may each independently be, e.g., a halogen atom.

The groups represented by Chemical Formulae 24-1 to 24-4 are aryloxy groups substituted with at least one halogen atom. In an implementation, when the halogen atom is substituted in an ortho position and/or a para position, luminance and a contrast ratio may be further improved. In an implementation, when the halogen atom is substituted in both of the ortho and para positions (two halogen atoms are substituted), there may be an effect of improving luminance and a contrast ratio, compared with when the halogen atom is substituted in either the ortho position or the para position (one halogen atom is substituted). In an implementation, when the halogen atom is substituted in the meta position, (even though another halogen atom is also substituted in the ortho position and/or the para position), there may be an insignificant effect of improving luminance and a contrast ratio.

For example, in the substituent represented by Chemical Formula 23 (e.g., the substituents represented by Chemical Formulae 24-1 to 24-4), luminance and a contrast ratio may be further improved in order of i→ii→iii; i) when the halogen atom is substituted in the meta position alone, ii) when the halogen atom is substituted in either the ortho position or the para position, and iii) when the halogen atom is substituted in both the ortho position and the para position.

In an implementation, at least one $R^{13}$ to $R^{28}$ may be a group represented by Chemical Formula 23 and at least one (e.g., other one) of $R^{13}$ to $R^{28}$ may be a group represented by Chemical Formula 25.

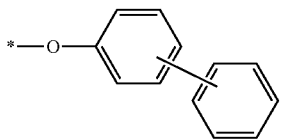

[Chemical Formula 25]

In an implementation, the group represented by Chemical Formula 25 may be, e.g., a group represented by Chemical Formula 25-1.

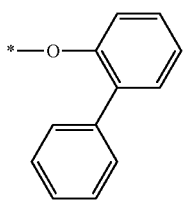

[Chemical Formula 25-1]

In an implementation, at least one of $R^{13}$ to $R^{16}$ may be a group represented by Chemical Formula 23, at least one of $R^{17}$ to $R^{20}$ may be a group represented by Chemical Formula 25, at least one of $R^{21}$ to $R^{24}$ may be a group represented by Chemical Formula 25, and at least one of $R^{25}$ to $R^{28}$ may be a group represented by Chemical Formula 25.

In an implementation, $R^{14}$ or $R^{15}$ may be a group represented by Chemical Formula 23, $R^{18}$ or $R^{19}$ may be a group represented by Chemical Formula 25, $R^{22}$ or $R^{23}$ may be a group represented by Chemical Formula 25, and $R^{26}$ or $R^{27}$ may be a group represented by Chemical Formula 25.

In an implementation, $R^{14}$ or $R^{15}$ may be a group represented by Chemical Formula 23, $R^{18}$ or $R^{19}$ may be a group represented by Chemical Formula 25, $R^{22}$ or $R^{23}$ may be a group represented by Chemical Formula 25, $R^{26}$ or $R^{27}$ may be a group represented by Chemical Formula 25, and the remaining groups not represented by Chemical Formula 23 and Chemical Formula 25 may be all halogen atoms.

In an implementation, at least one of $R^{13}$ to $R^{16}$ may be a group represented by Chemical Formula 23, at least one of $R^{17}$ to $R^{20}$ may be a group represented by Chemical Formula 25, at least one of $R^{21}$ to $R^{24}$ may be a group represented by Chemical Formula 23, and at least one of $R^{25}$ to $R^{28}$ may be a group represented by Chemical Formula 25.

In an implementation, $R^{14}$ or $R^{15}$ may be a group represented by Chemical Formula 23, $R^{18}$ or $R^{19}$ may be a group represented by Chemical Formula 25, $R^{22}$ or $R^{23}$ may be a group represented by Chemical Formula 23, and $R^{26}$ or $R^{27}$ may be a group represented by Chemical Formula 25.

In an implementation, $R^{14}$ or $R^{15}$ may be a group represented by Chemical Formula 23, $R^{18}$ or $R^{19}$ may be a group represented by Chemical Formula 25, $R^{22}$ or $R^{23}$ may be a group represented by Chemical Formula 23, $R^{26}$ or $R^{27}$ may be a group represented by Chemical Formula 25, and the remaining groups not represented by Chemical Formula 23 and Chemical Formula 25 may be all halogen atoms.

In an implementation, at least one of $R^{13}$ to $R^{16}$ may be a group represented by Chemical Formula 23, at least one of $R^{17}$ to $R^{20}$ may be a group represented by Chemical Formula 23, at least one of $R^{21}$ to $R^{24}$ may be a group represented by Chemical Formula 23, and at least one of $R^{25}$ to $R^{28}$ may be a group represented by Chemical Formula 25.

In an implementation, $R^{14}$ or $R^{15}$ may be a group represented by Chemical Formula 23, $R^{18}$ or $R^{19}$ may be a group represented by Chemical Formula 23, $R^{22}$ or $R^{23}$ may be a group represented by Chemical Formula 23, and $R^{26}$ or $R^{27}$ may be a group represented by Chemical Formula 25.

In an implementation, $R^{14}$ or $R^{15}$ may be a group represented by Chemical Formula 23, $R^{18}$ or $R^{19}$ may be a group represented by Chemical Formula 23, $R^{22}$ or $R^{23}$ may be a group represented by Chemical Formula 23, $R^{26}$ or $R^{27}$ may be a group represented by Chemical Formula 25, and the remaining groups not represented by Chemical Formula 23 and Chemical Formula 25 may be all halogen atoms.

In an implementation, at least one of $R^{13}$ to $R^{16}$ may be a group represented by Chemical Formula 23, at least one of $R^{17}$ to $R^{20}$ may be a group represented by Chemical Formula 23, at least one of $R^{21}$ to $R^{24}$ may be a group represented by Chemical Formula 23, and at least one of $R^{25}$ to $R^{28}$ may be a group represented by Chemical Formula 23.

In an implementation, $R^{14}$ or $R^{15}$ may be a group represented by Chemical Formula 23, $R^{18}$ or $R^{19}$ may be a group represented by Chemical Formula 23, $R^{22}$ or $R^{23}$ may be a group represented by Chemical Formula 23, and $R^{26}$ or $R^{27}$ may be a group represented by Chemical Formula 23.

In an implementation, $R^{14}$ or $R^{15}$ may be a group represented by Chemical Formula 23, $R^{18}$ or $R^{19}$ may be a group represented by Chemical Formula 23, $R^{22}$ or $R^{23}$ may be a group represented by Chemical Formula 23, $R^{26}$ or $R^{27}$ may be a group represented by Chemical Formula 23, and the remaining groups not represented by Chemical Formula 23 may be all halogen atoms.

In an implementation, the second green dye represented by Chemical Formula 2 may be, e.g., represented by one of Chemical Formula 26 to Chemical Formula 35.

[Chemical Formula 26]
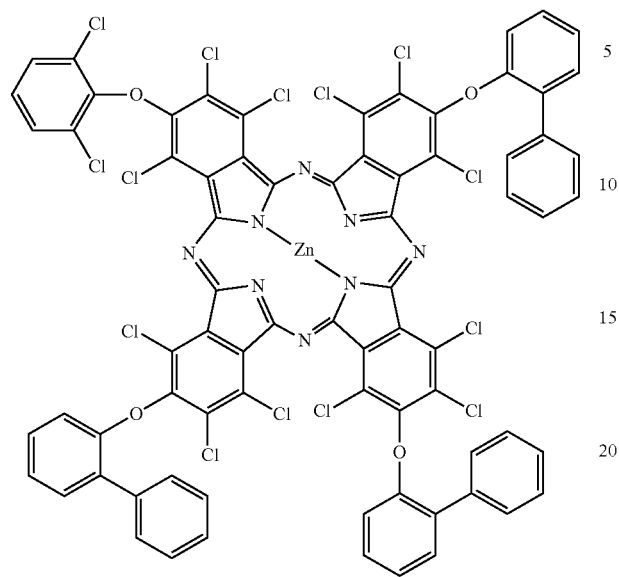
[Chemical Formula 27]
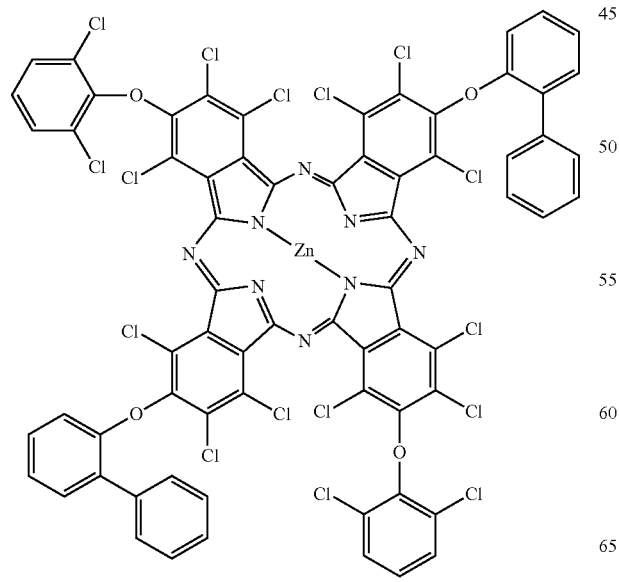
[Chemical Formula 28]
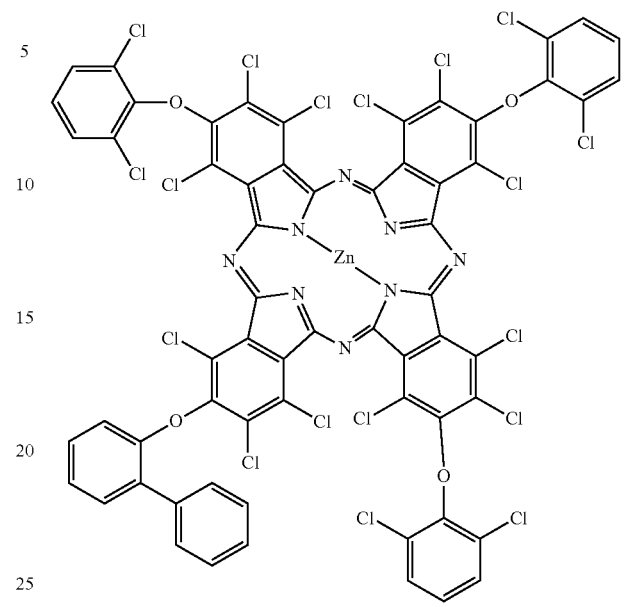
[Chemical Formula 29]
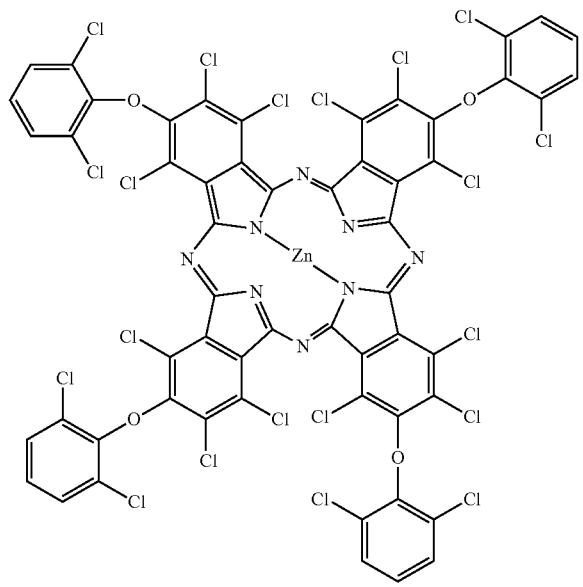

[Chemical Formula 30]
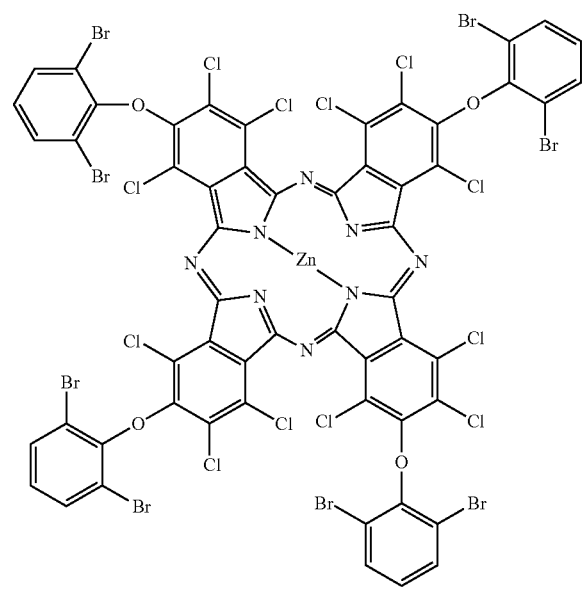
[Chemical Formula 31]
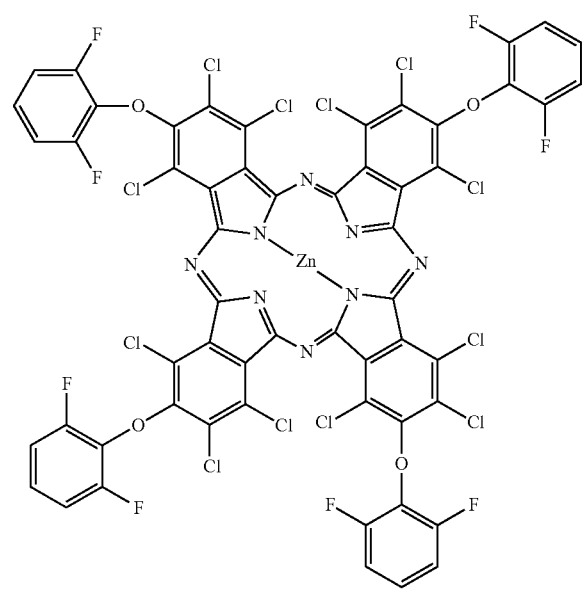
[Chemical Formula 32]
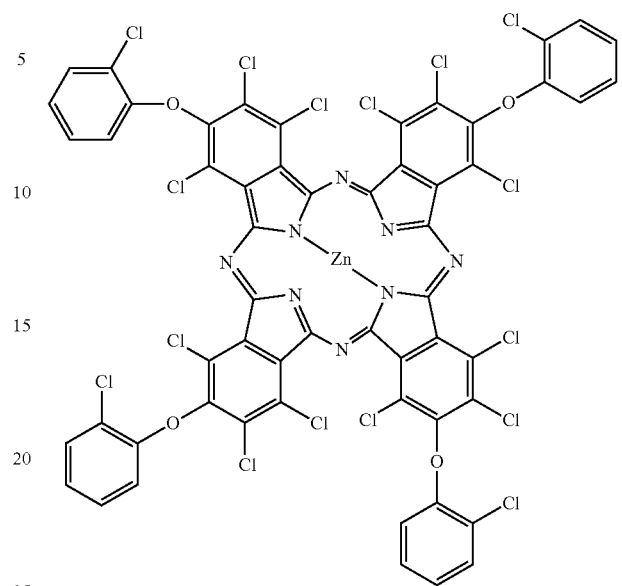
[Chemical Formula 33]
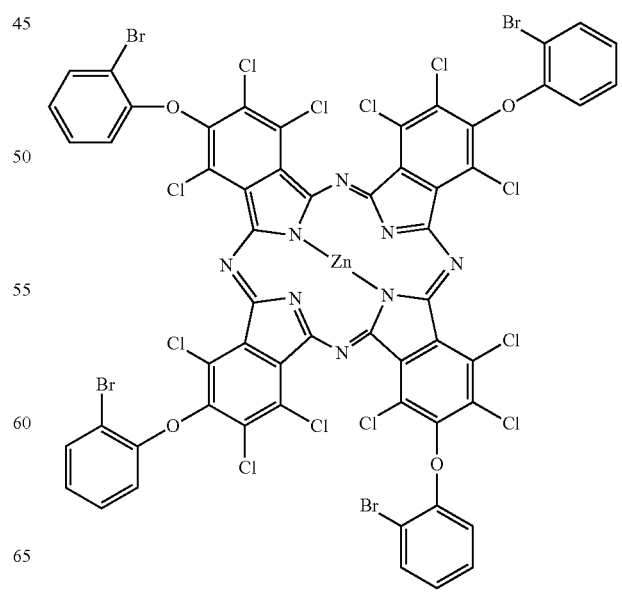

[Chemical Formula 34]

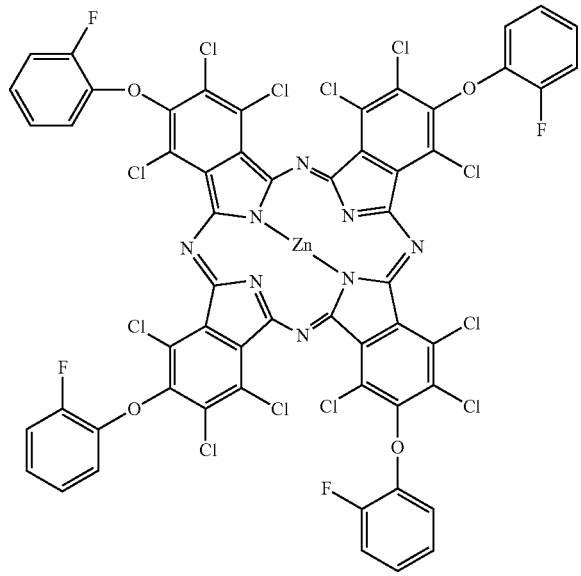

[Chemical Formula 35]

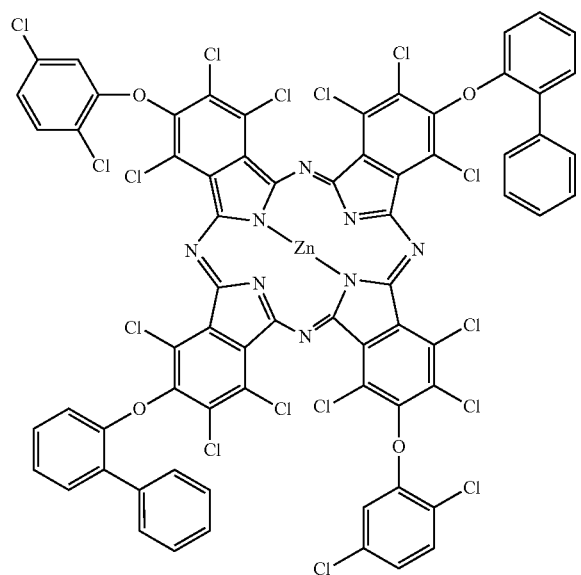

The second green dye represented by Chemical Formula 2 may include, e.g., the substituent represented by one of Chemical Formula 24-1 to Chemical Formula 24-4, and may realize a clearer color in a small amount, and accordingly, when used as a colorant, may realize a display device having excellent color characteristics such as excellent luminance, an excellent contrast ratio, and the like. In an implementation, the green dye may have a maximum transmittance (e.g., a wavelength of peak transmittance) at a wavelength of, e.g., about 445 nm to about 560 nm.

In an implementation, the colorant may further include, e.g., at least one of a green dye, a green pigment, a yellow dye, and a yellow pigment, in addition to the first green dye and the second green dye.

The first green dye and the second green dye (e.g., the colorant) may be included in the composition an amount of, e.g., about 1 wt % to about 30 wt %, or about 3 wt % to about 20 wt %, based on a total weight of the photosensitive resin composition. When the colorant is used within the range, high luminance and a high contrast ratio at a desirable color coordinate may be realized.

(B) Binder Resin

The binder resin may be a copolymer of a first ethylenic unsaturated monomer and a second ethylenic unsaturated monomer that is copolymerizable therewith, and may be a resin including at least one acryl repeating unit.

The first ethylenic unsaturated monomer may be, e.g., an ethylenic unsaturated monomer including at least one carboxyl group. Examples of the monomer may include (meth) acrylic acid, maleic acid, itaconic acid, fumaric acid, or a combination thereof.

Repeating units of the first ethylenic unsaturated monomer may be included in the binder resin in an amount of, e.g., about 5 wt % to about 50 wt %, or about 10 wt % to about 40 wt %, based on a total weight of the binder resin.

The second ethylenic unsaturated monomer may be, e.g., an aromatic vinyl compound such as styrene, α-methylstyrene, vinyl toluene, vinylbenzylmethylether and the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; an unsaturated amino alkyl carboxylate ester compound such as 2-aminoethyl(meth) acrylate, 2-dimethylaminoethyl(meth)acrylate, and the like; a carboxylic acid vinyl ester compound such as vinyl acetate, vinyl benzoate, and the like; an unsaturated glycidyl carboxylate ester compound such as glycidyl(meth)acrylate, and the like; a vinyl cyanide compound such as (meth) acrylonitrile and the like; an unsaturated amide compound such as (meth)acrylamide, and the like; and the like, and may be used alone or as a mixture of two or more.

Examples of the binder resin may include a methacrylic acid/benzylmethacrylate copolymer, a methacrylic acid/benzylmethacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer and the like. These may be used alone or as a mixture of two or more.

A weight average molecular weight of the binder resin may be, e.g., about 3,000 g/mol to about 150,000 g/mol, about 5,000 g/mol to about 50,000 g/mol, or about 20,000 g/mol to about 30,000 g/mol. When the binder resin has a weight average molecular weight within the range, close contacting properties with a substrate and physicochemical properties are improved and viscosity is appropriate.

An acid value of the binder resin may be, e.g., 15 mgKOH/g to 60 mgKOH/g, or 20 mgKOH/g to 50 mgKOH/g. When the binder resin has an acid value within the range, excellent resolution of a pixel may be obtained.

The binder resin may be included in the composition in an amount of, e.g., about 0.1 wt % to about 20 wt %, or about 1 wt % to about 15 wt %, based on the total weight of the photosensitive resin composition. When the binder resin is included within the above ranges, developability may be improved and excellent surface smoothness may be improved due to improved cross-linking during the manufacture of a color filter.

(C) Photopolymerizable Compound

The photopolymerizable compound may be, e.g., a mono-functional or multi-functional ester of (meth)acrylic acid including at least one ethylenic unsaturated double bond.

The photopolymerizable compound may cause sufficient polymerization during exposure in a pattern-forming process and form a pattern having excellent heat resistance, light resistance, and chemical resistance due to the ethylenic unsaturated double bond.

Examples of the photopolymerizable compound may include ethylene glycol di(meth)acrylate, diethylene glycol di(meth)acrylate, triethylene glycol di(meth)acrylate, propylene glycol di(meth)acrylate, neopentyl glycol di(meth) acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth) acrylate, dipentaerythritol di(meth)acrylate, dipentaerythritol tri(meth)acrylate, dipentaerythritol penta (meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolacepoxy (meth) acrylate, and the like.

Commercially available examples of the photopolymerizable compound may be as follows. The mono-functional (meth)acrylic acid ester may include Aronix M-101®, Aronix M-111®, Aronix M-114® (Toagosei Chemistry Industry Co., Ltd.); KAYARAD TC-110S, KAYARAD TC-120S® (Nippon Kayaku Co., Ltd.); V-158®, V-2311® (Osaka Organic Chemical Ind., Ltd.), and the like. Examples of a difunctional (meth)acrylic acid ester may include Aronix M-210®, Aronix M-240®, Aronix M-6200® (Toagosei Chemistry Industry Co., Ltd.), KAYARAD HDDA®, KAYARAD HX-220®, KAYARAD R-604® (Nippon Kayaku Co., Ltd.), V-260®, V-312®, V-335 HP® (Osaka Organic Chemical Ind., Ltd.), and the like. Examples of a tri-functional (meth)acrylic acid ester may include Aronix M-309®, Aronix M-400®, Aronix M-405®, Aronix M-450®, Aronix M-7100®, Aronix M-8030®, Aronix M-8060® (Toagosei Chemistry Industry Co., Ltd.); KAYARAD TMPTA®, KAYARAD DPCA-20®, KAYARAD DPCA-30®, KAYARAD DPCA-60®, KAYARAD DPCA-120® (Nippon Kayaku Co., Ltd.); V-295®, V-300®, V-360®, V-GPT®, V-3PA®, V-400® (Osaka Yuki Kayaku Kogyo Co. Ltd.), and the like. These may be used alone or as a mixture of two or more.

The photopolymerizable compound may be treated with acid anhydride to improve developability.

The photopolymerizable compound may be included in the composition in an amount of, e.g., about 0.1 wt % to about 30 wt %, or about 1 wt % to about 15 wt %, based on the total weight of the photosensitive resin composition. When the photopolymerizable monomer is included within the range, pattern characteristic and developability during manufacture of a color filter may be improved.

(D) Photopolymerization Initiator

The photopolymerization initiator may be, e.g., an acetophenone compound, a benzophenone compound, a thioxanthone compound, a benzoin compound, a triazine compound, an oxime compound, or the like.

Examples of the acetophenone compound may include 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone compound may include benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone compound may include thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin compound may include benzoin, benzoin methyl ether, benzoin ethyl ether, benzoin isopropyl ether, benzoin isobutyl ether, benzyldimethylketal, and the like.

Examples of the triazine compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphthol-yl)-4,6-bis (trichloromethyl)-s-triazine, 2-(4-methoxynaphtho 1-yl)-4, 6-bis(trichloromethyl)-s-triazine, 2-4-trichloromethyl (piperonyl)-6-triazine, 2-4-trichloromethyl (4'-methoxystyryl)-6-triazine, and the like.

Examples of the oxime compound may include 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, and the like.

In an implementation, the photopolymerization initiator may further include a carbazole compound, a diketone compound, a sulfonium borate compound, a diazo compound, an imidazole compound, a biimidazole compound, a fluorene compound, or the like in addition to the above-described compounds.

The photopolymerization initiator may be included in the composition in an amount of, e.g., about 0.1 wt % to about 5 wt %, or about 0.5 wt % to about 3 wt %, based on the total weight of the photosensitive resin composition. When the photopolymerization initiator is included within the range, the composition may be sufficiently photopolymerized when exposed to light during the pattern-forming process for preparing a color filter, accomplishing excellent sensitivity and improving transmittance.

(E) Solvent

The solvent may include, e.g., alcohols such as methanol, ethanol, and the like; ethers such as dichloroethyl ether, n-butyl ether, diisoamyl ether, methylphenyl ether, tetrahydrofuran, and the like; glycol ethers such as ethylene glycol methylether, ethylene glycol ethylether, propylene glycol methylether and the like; shellosolve acetates such as methyl shellosolve acetate, ethyl shellosolve acetate, diethyl shellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone and the like; saturated aliphatic monocarboxylic acid alkyl esters such as ethyl acetate, n-butyl acetate, isobutyl acetate, and the like; lactic acid alkyl esters such as methyl lactate, ethyl lactate, and the like; hydroxyacetic acid alkyl esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; or ketonate esters such as ethyl pyruvate, and the like, and additionally N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl shellosolve acetate, and the like, which may be used alone or as a mixture of two or more.

Considering miscibility and reactivity, the solvent may include, e.g., glycol ethers such as ethylene glycol monoethyl ether, and the like; ethylene glycol alkylether acetates such as ethyl shellosolve acetate, and the like; esters such as 2-hydroxyethyl propionate, and the like; diethylene glycols such as diethylene glycol monomethyl ether, and the like; propylene glycol alkylether acetates such as propylene glycol monomethylether acetate, propylene glycol propylether acetate, and the like.

The solvent may be included in the composition in a balance amount, e.g., about 45 wt % to about 97 wt %, based on the total weight of the photosensitive resin composition. When the solvent is included within the ranges, a coating property of the photosensitive resin composition is improved and excellent flatness of a film having a thickness of 3 μm or greater may be maintained.

(F) Other Additives

In an implementation, the photosensitive resin composition may further include an additive, e.g., malonic acid; 3-amino-1,2-propanediol; a silane coupling agent including a vinyl group or a (meth)acryloxy group; a leveling agent; a fluorine-based surfactant; a radical polymerization initiator, or the like in order to, e.g., prevent stains or spots during the coating, to adjust leveling, or to prevent pattern residue due to non-development.

In an implementation, the photosensitive resin composition may further include an additive such as an epoxy compound or the like in order to improve a close contacting property with a substrate.

Examples of the epoxy compound may include a phenol novolac epoxy compound, a tetramethyl biphenyl epoxy compound, a bisphenol A epoxy compound, an alicyclic epoxy compound, or a combination thereof.

An amount of the additive may be controlled according to desirable properties.

Another embodiment provides a photosensitive resin layer manufactured using the aforementioned photosensitive resin composition.

Another embodiment provides a color filter including the photosensitive resin layer. A method of manufacturing the color filter is as follows.

The photosensitive resin composition for a color filter may be coated on a bare glass substrate, or on a glass substrate on which SiN, is coated in a thickness of about 500 Å to about 1,500 Å as a protective layer using an appropriate method of spin-coating, slit-coating, and the like to have a thickness of about 1 μm to about 3 μm. After the coating, light may be irradiated to form a pattern for a color filter. After irradiation, the coated layer may be treated with an alkali developing solution, and a non-radiated region of the coated layer may be dissolved, forming a pattern for an image color filter. This process may be repeated depending on the desired number of R, G, and B colors, fabricating a color filter having a desired pattern.

In addition, the image pattern acquired by the development may be cured through heat treatment, actinic ray radiation, or the like, resultantly improving crack resistance, solvent resistance, and the like.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

(Preparation of Green Dye 1)

Synthesis Example 1: Synthesis of Intermediate A-1

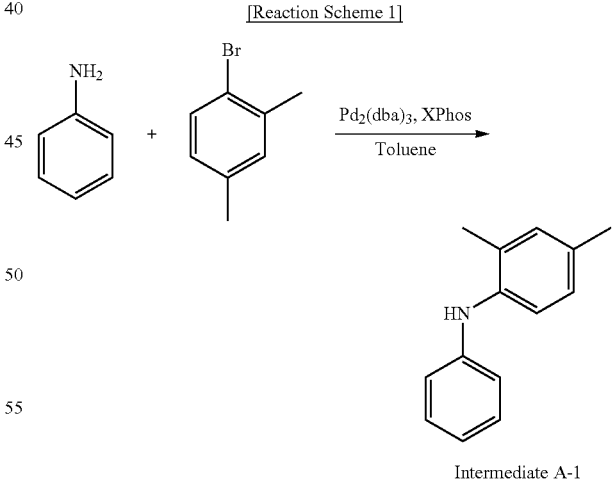

Intermediate A-1

Aniline (10 mol), 1-bromo-2,4-dimethylbenzene (10 mol), $Pd_2(dba)_3$ (0.1 mol), and XPhos (0.1 mol) were added to toluene and heated and stirred at 100° C. for 24 hours. Ethyl acetate was added to the solution, and the obtained mixture was washed twice to extract an organic layer. The extracted organic layer was distilled under a reduced pressure and purified through column chromatography to obtain Intermediate A-1.

Synthesis Example 2: Synthesis of Intermediate A-2

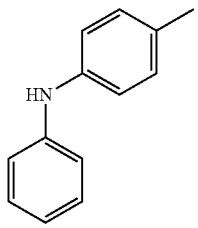

Intermediate A-2

Intermediate A-2 was obtained in the same manner as in Synthesis Example 1 except that 4-bromotoluene was used instead of 1-bromo-2,4-dimethyl-benzene.

Synthesis Example 3: Synthesis of Intermediate A-3

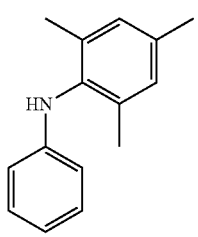

Intermediate A-3

Intermediate A-3 was obtained in the same manner as in Synthesis Example 1 except that mesityl bromide was used instead of 1-bromo-2,4-dimethyl-benzene.

Synthesis Example 4: Synthesis of Intermediate B-1

[Reaction Scheme 2]

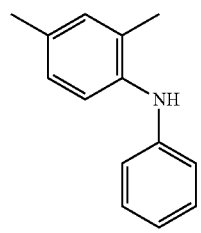 

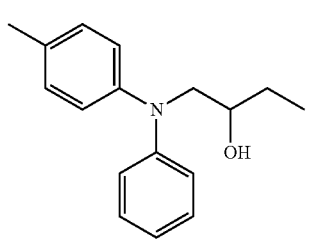

Intermediate B-1

Intermediate A-1 (10 mol), 1,2-butylene oxide (10 mol), and sodium hydride (12 mol) were added to N,N-dimethyl formamide and heated and stirred at 90° C. for 24 hours. Ethyl acetate was added to the solution, and the obtained mixture was washed twice to extract an organic layer. The extracted organic layer was distilled under a reduced pressure and separated through column chromatography to obtain Intermediate B-1.

Synthesis Example 5: Synthesis of Intermediate B-2

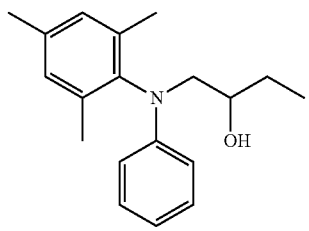

Intermediate B-2

Intermediate B-2 was obtained in the same manner as in Synthesis Example 4 except that Intermediate A-2 was used instead of Intermediate A-1.

Synthesis Example 6: Synthesis of Intermediate B-3

Intermediate B-3

Intermediate B-3 was obtained in the same manner as in Synthesis Example 4 except that Intermediate A-3 was used instead of Intermediate A-1.

Synthesis Example 7: Synthesis of Intermediate B-4

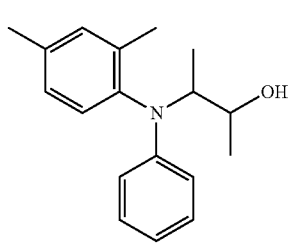

Intermediate B-4

Intermediate B-4 was obtained in the same manner as in Synthesis Example 4 except that 2,3-butylene oxide was used instead of 1,2-butylene oxide.

Synthesis Example 8: Synthesis of Intermediate B-5

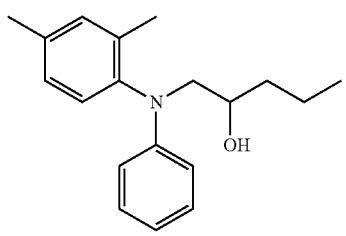

Intermediate B-5

Intermediate B-5 was obtained in the same manner as in Synthesis Example 4 except that 1,2-epoxypentane was used instead of 1,2-butylene oxide.

Synthesis Example 9: Synthesis of Intermediate B-6

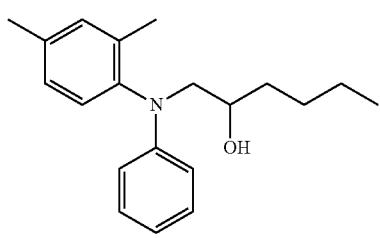

Intermediate B-6

Intermediate B-6 was obtained in the same manner as in Synthesis Example 4 except that 1,2-epoxyhexane was used instead of 1,2-butylene oxide.

Synthesis Example 10: Synthesis of Intermediate B-7

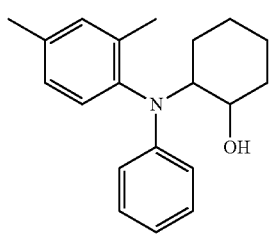

Intermediate B-7

Intermediate B-7 was obtained in the same manner as in Synthesis Example 4 except that 1,2-epoxycyclohexane was used instead of 1,2-butylene oxide.

Synthesis Example 11: Synthesis of Intermediate C-1

[Reaction Scheme 3]

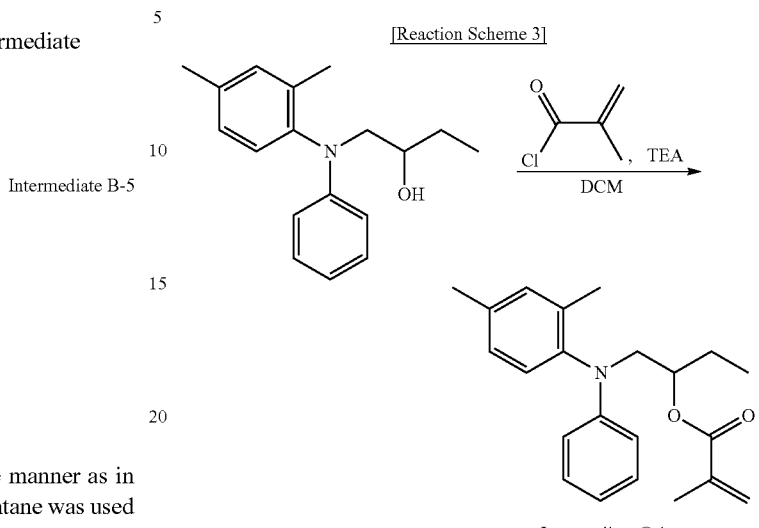

Intermediate C-1

Intermediate B-1 (10 mmol), methacryloyl chloride (10 mmol), and triethylamine (15 mmol) were added to dichloromethane and stirred at ambient temperature for 24 hours. Ethyl acetate was added to the solution, and the obtained mixture was washed twice to extract an organic layer. The extracted organic layer was distilled under a reduced pressure and separated through column chromatography to obtain Intermediate C-1.

Synthesis Example 12: Synthesis of Intermediate C-2

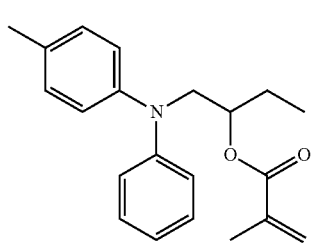

Intermediate C-2

Intermediate C-2 was obtained in the same manner as in Synthesis Example 11 except that Intermediate B-2 was used instead of Intermediate B-1.

Synthesis Example 13: Synthesis of Intermediate C-3

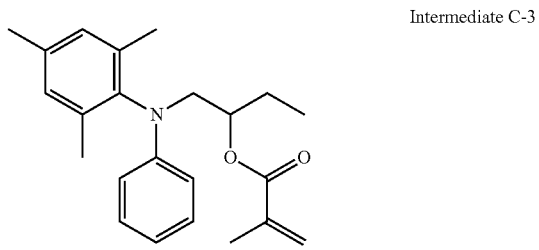 [SMILES: C=C(C)C(=O)OC(CC)CN(c1ccccc1)c1c(C)cc(C)cc1C]

Intermediate C-3

Intermediate C-3 was obtained in the same manner as in Synthesis Example 11 except that Intermediate B-3 was used instead of Intermediate B-1.

Synthesis Example 14: Synthesis of Intermediate C-4

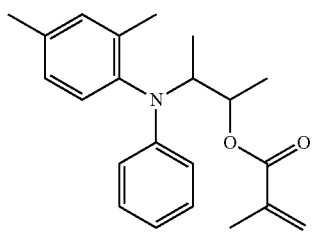

Intermediate C-4

Intermediate C-4 was obtained in the same manner as in Synthesis Example 11 except that Intermediate B-4 was used instead of Intermediate B-1.

Synthesis Example 15: Synthesis of Intermediate C-5

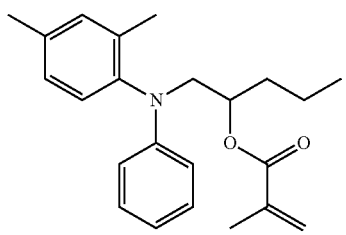

Intermediate C-5

Intermediate C-5 was obtained in the same manner as in Synthesis Example 11 except that Intermediate B-5 was used instead of Intermediate B-1.

Synthesis Example 16: Synthesis of Intermediate C-6

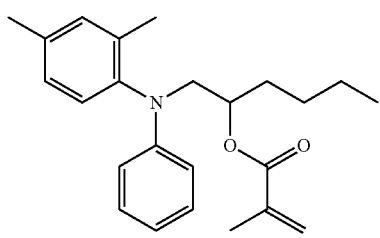

Intermediate C-6

Intermediate C-6 was obtained in the same manner as in Synthesis Example 11 except that Intermediate B-6 was used instead of Intermediate B-1.

Synthesis Example 17: Synthesis of Intermediate C-7

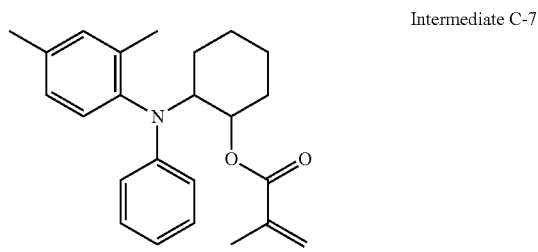 [SMILES: C=C(C)C(=O)OC1CCCCC1N(c1ccccc1)c1ccc(C)cc1C]

Intermediate C-7

Intermediate C-7 was obtained in the same manner as in Synthesis Example 11 except that Intermediate B-7 was used instead of Intermediate B-1.

Synthesis Example 18: Synthesis of Compound Represented by Chemical Formula 1-1

[Reaction Scheme 4]

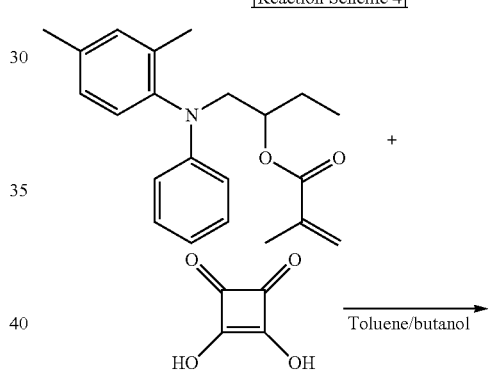

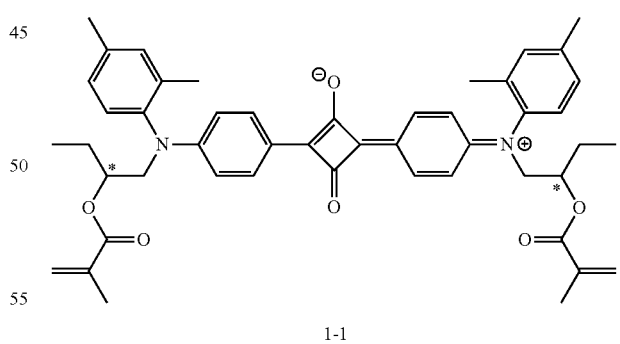

1-1

Intermediate C-1 (60 mmol) and 3,4-dihydroxy-3-cyclobutyne-1,2-dione (30 mmol) were added to toluene (200 mL) and butanol (200 mL) and refluxed to remove products with a Dean-stark distillation device. After stirring for 12 hours, the green reactants were distilled under a reduced pressure and purified by column chromatography to obtain a compound represented by Chemical Formula 1-1 (MALDI-TOF MS: 752.38 m/z).

Synthesis Example 19: Synthesis of Compound Represented by Chemical Formula 1-2

A compound represented by Chemical Formula 1-2 was obtained in the same manner as in Synthesis Example 18 except that Intermediate C-2 was used instead of Intermediate C-1.

[Chemical Formula 1-2]

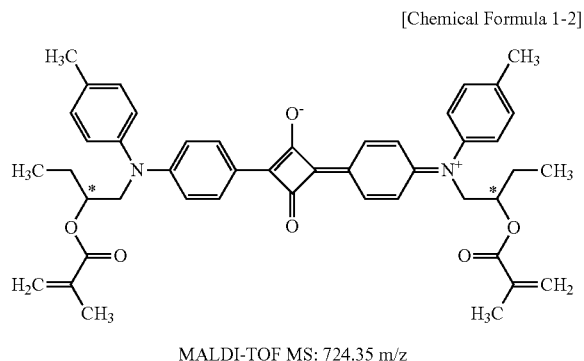 [SMILES: C=C(C)C(=O)OC(CC)CN(c1ccc(C)cc1)c1ccc(C2=C([O-])C(=C3C=CC(=[N+](CC(CC)OC(=O)C(=C)C)c4ccc(C)cc4)C=C3)C2=O)cc1]

MALDI-TOF MS: 724.35 m/z

Synthesis Example 20: Synthesis of Compound Represented by Chemical Formula 1-3

A compound represented by Chemical Formula 1-3 was obtained in the same manner as in Synthesis Example 18 except that Intermediate C-3 was used instead of Intermediate C-1.

[Chemical Formula 1-3]

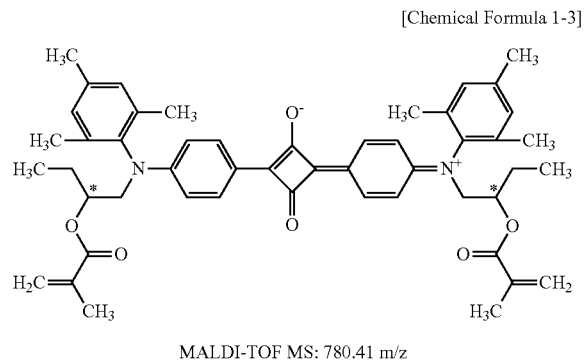 [SMILES: C=C(C)C(=O)OC(CC)CN(c1ccc(C2=C([O-])C(=C3C=CC(=[N+](CC(CC)OC(=O)C(=C)C)c4c(C)cc(C)cc4C)C=C3)C2=O)cc1)c1c(C)cc(C)cc1C]

MALDI-TOF MS: 780.41 m/z

Synthesis Example 21: Synthesis of Compound Represented by Chemical Formula 1-4

A compound represented by Chemical Formula 1-4 was obtained in the same manner as in Synthesis Example 18 except that Intermediate C-4 was used instead of Intermediate C-1.

[Chemical Formula 1-4]

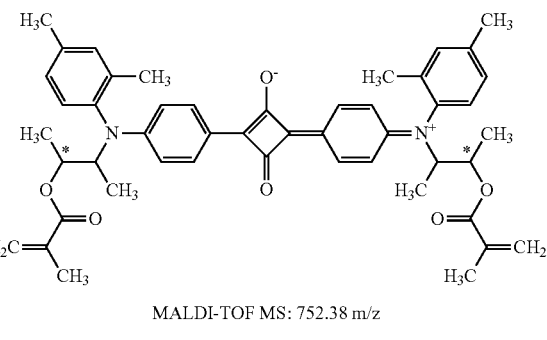

MALDI-TOF MS: 752.38 m/z

Synthesis Example 22: Synthesis of Compound Represented by Chemical Formula 1-5

A compound represented by Chemical Formula 1-5 was obtained in the same manner as in Synthesis Example 18 except that Intermediate C-5 was used instead of Intermediate C-1.

[Chemical Formula 1-5]

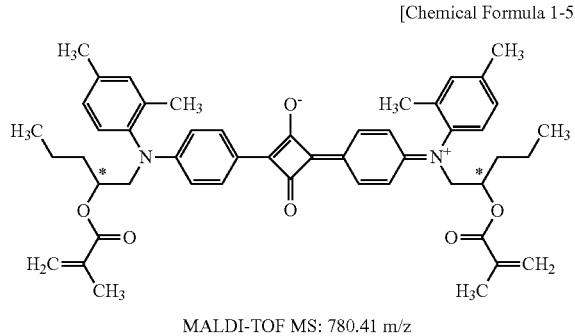 [SMILES: C=C(C)C(=O)OC(CCC)CN(c1ccc(C2=C([O-])C(=C3C=CC(=[N+](CC(CCC)OC(=O)C(=C)C)c4ccc(C)cc4C)C=C3)C2=O)cc1)c1ccc(C)cc1C]

MALDI-TOF MS: 780.41 m/z

Synthesis Example 23: Synthesis of Compound Represented by Chemical Formula 1-6

A compound represented by Chemical Formula 1-6 was obtained in the same manner as in Synthesis Example 18 except that Intermediate C-6 was used instead of Intermediate C-1.

[Chemical Formula 1-6]

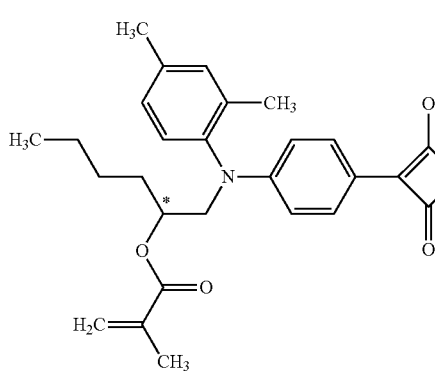

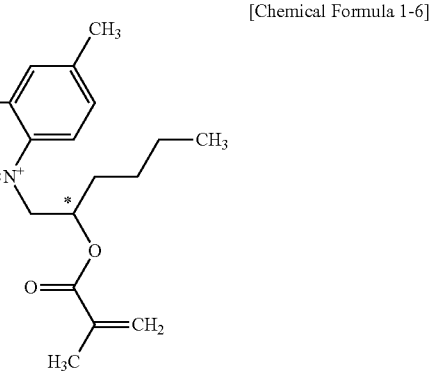

MALDI-TOF MS: 808.45 m/z

Synthesis Example 24: Synthesis of Compound Represented by Chemical Formula 1-7

A compound represented by Chemical Formula 1-7 was obtained in the same manner as in Synthesis Example 18 except that Intermediate C-7 was used instead of Intermediate C-1.

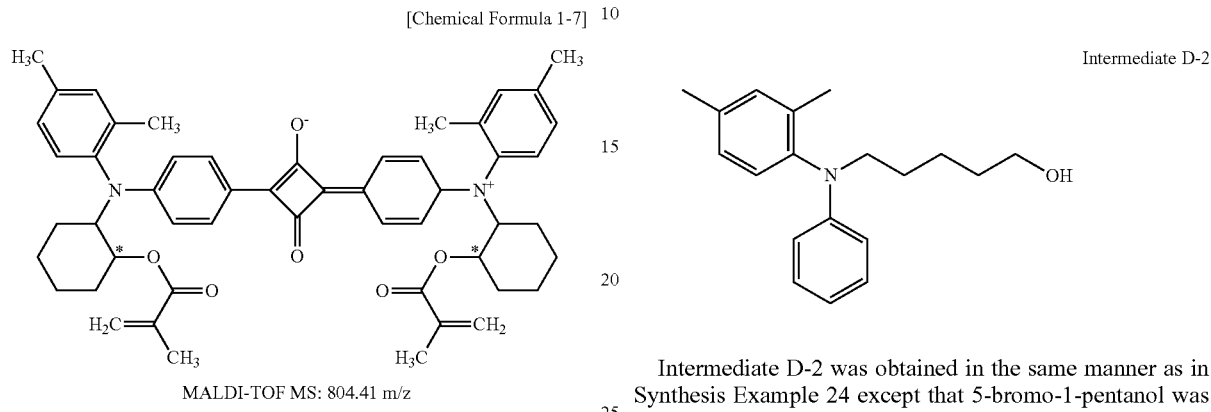

[Chemical Formula 1-7]

MALDI-TOF MS: 804.41 m/z

Synthesis Example 25: Synthesis of Intermediate D-1

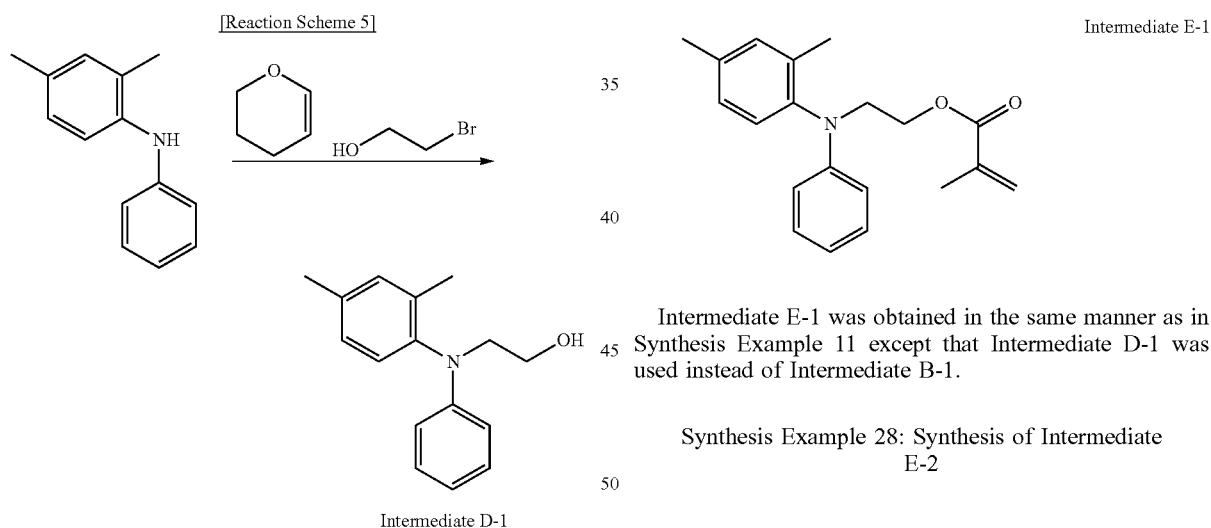

[Reaction Scheme 5]

Intermediate D-1

2-Bromoethanol (10 mmol), 3,4-dihydro-2H-pyran (10 mmol), and p-toluenesulfonic acid monohydrate (0.05 mmol) were added to dichloromethane and stirred for 1 hour. Ethyl acetate was added to the solution, and the obtained mixture was washed twice to extract an organic layer. Intermediate A-1 was added to N,N-dimethyl formamide, sodium hydride (12 mol) was added in a dropwise fashion, and the mixture was stirred for 2 hours. The extracted organic material was added in a dropwise fashion and stirred for 12 hours. Ethyl acetate was added to this solution and washed twice with water, the organic layer was extracted to remove the solvent, and the resultant was added to methanol in a dropwise fashion together with p-toluenesulfonic acid monohydrate (0.05 mmol). After stirring for 2 hours, ethyl acetate was added thereto, and the mixture was washed twice with water. The organic layer was extracted to remove the solvent and separated by column chromatography to obtain Intermediate D-1.

Synthesis Example 26: Synthesis of Intermediate D-2

Intermediate D-2

Intermediate D-2 was obtained in the same manner as in Synthesis Example 24 except that 5-bromo-1-pentanol was used instead of 2-bromoethanol.

Synthesis Example 27: Synthesis of Intermediate E-1

Intermediate E-1

Intermediate E-1 was obtained in the same manner as in Synthesis Example 11 except that Intermediate D-1 was used instead of Intermediate B-1.

Synthesis Example 28: Synthesis of Intermediate E-2

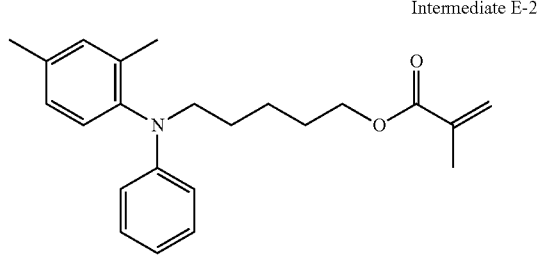 [SMILES: C=C(C)C(=O)OCCCCCN(c1ccccc1)c1ccc(C)cc1C]

Intermediate E-2

Intermediate E-2 was obtained in the same manner as in Synthesis Example 11 except that Intermediate D-2 was used instead of Intermediate B-1.

Reference Synthesis Example 1: Synthesis of Compound Represented by Chemical Formula F-1

A compound represented by Chemical Formula F-1 was obtained in the same manner as in Synthesis Example 18 except that Intermediate E-1 was used instead of Intermediate C-1.

[Chemical Formula F-1]

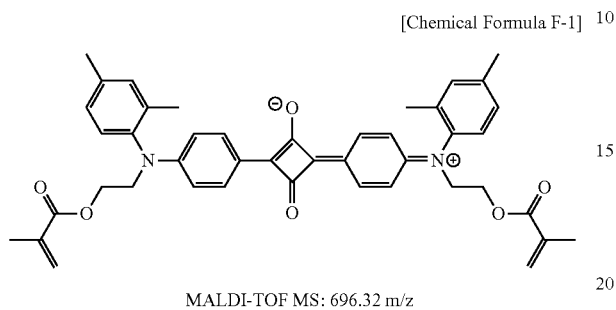

MALDI-TOF MS: 696.32 m/z

Reference Synthesis Example 2: Synthesis of Compound Represented by Chemical Formula F-2

A compound represented by Chemical Formula F-2 was obtained in the same manner as in Synthesis Example 18 except that Intermediate E-2 was used instead of Intermediate C-1.

[Chemical Formula F-2]

MALDI-TOF MS: 780.41 m/z

Synthesis Example 29: Synthesis of Core-Shell Dye Represented by Chemical Formula 9

[Reaction Scheme 6]

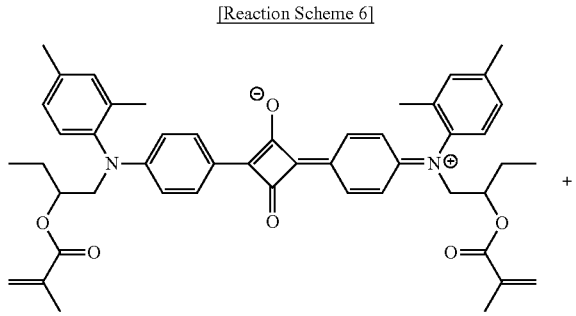

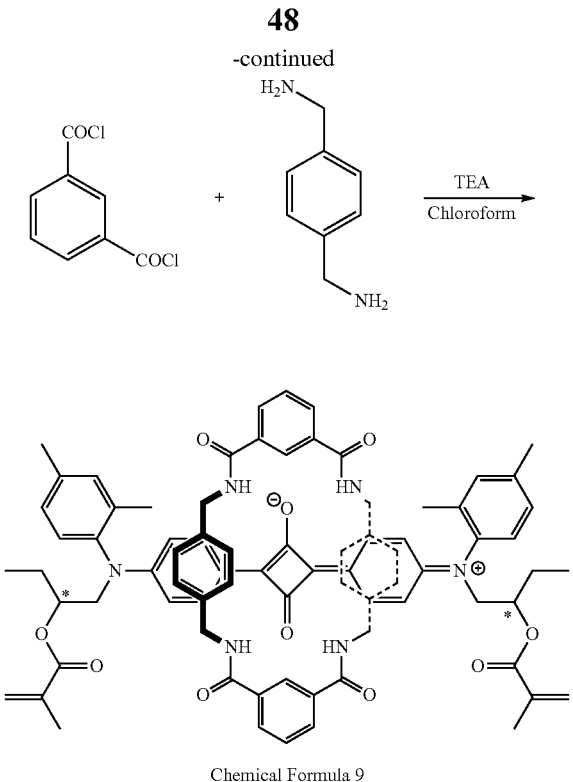

Chemical Formula 9

The compound represented by Chemical Formula 1-1 (5 mmol) was dissolved in 600 mL of a chloroform solvent, and a solution obtained by dissolving isophthaloyl chloride (20 mmol) and p-xylylene diamine (20 mmol) in 60 mL of chloroform was added in a dropwise fashion thereto at ambient temperature for 5 hours. After 12 hours, the obtained mixture was distilled under a reduced pressure and separated through column chromatography to synthesize a compound represented by Chemical Formula 9 (MALDI-TOF MS: 1284.59 m/z).

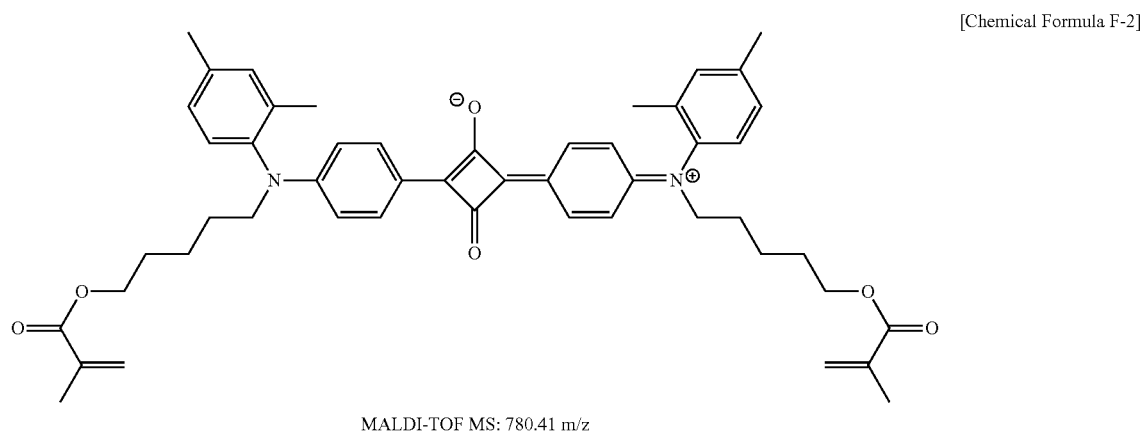 [SMILES: C=C(C)C(=O)OCCCCCN(c1ccc(C2=C([O-])C(=C3C=CC(=[N+](CCCCCOC(=O)C(=C)C)c4ccc(C)cc4C)C=C3)C2=O)cc1)c1ccc(C)cc1C]

Synthesis Example 30: Synthesis of Core-Shell Dye Represented by Chemical Formula 10

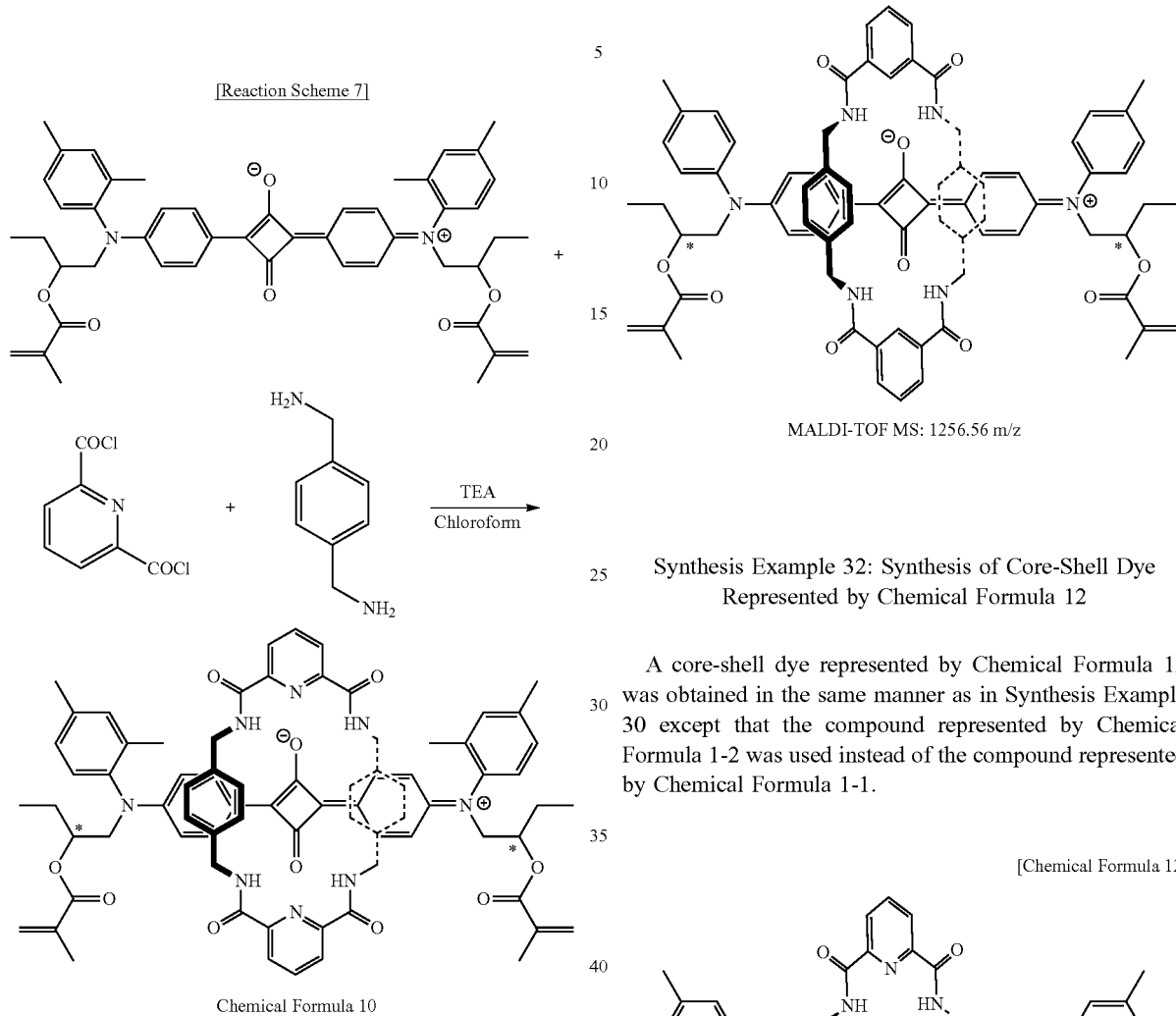

Chemical Formula 10

The compound represented by Chemical Formula 1-1 (5 mmol) was dissolved in 600 mL of a chloroform solvent, and triethylamine (50 mmol) was added thereto. 2,6-pyridinedicarbonyl dichloride (20 mmol) and p-xylylene diamine (20 mmol) were dissolved in 60 mL of chloroform, and the obtained solution was added in a dropwise fashion to the solution at ambient temperature for 5 hours. After 12 hours, the obtained mixture was distilled under a reduced pressure and separated through column chromatography to synthesize a core-shell dye represented by Chemical Formula 10 (MALDI-TOF MS: 1286.58 m/z).

Synthesis Example 31: Synthesis of Core-Shell Dye Represented by Chemical Formula 11

A core-shell dye represented by Chemical Formula 11 was obtained in the same manner as in Synthesis Example 29 except that the compound represented by Chemical Formula 1-2 was used instead of the compound represented by Chemical Formula 1-1.

[Chemical Formula 11]

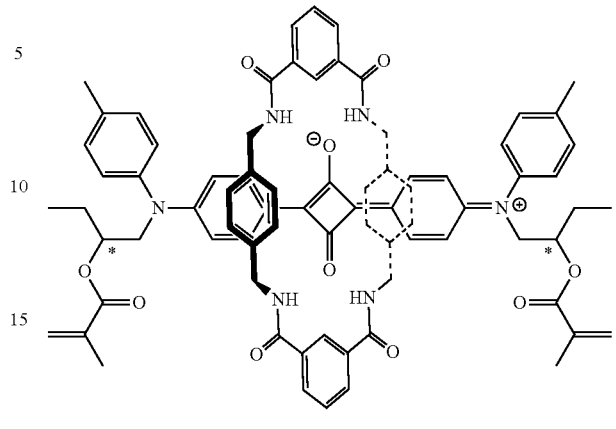

MALDI-TOF MS: 1256.56 m/z

Synthesis Example 32: Synthesis of Core-Shell Dye Represented by Chemical Formula 12

A core-shell dye represented by Chemical Formula 12 was obtained in the same manner as in Synthesis Example 30 except that the compound represented by Chemical Formula 1-2 was used instead of the compound represented by Chemical Formula 1-1.

[Chemical Formula 12]

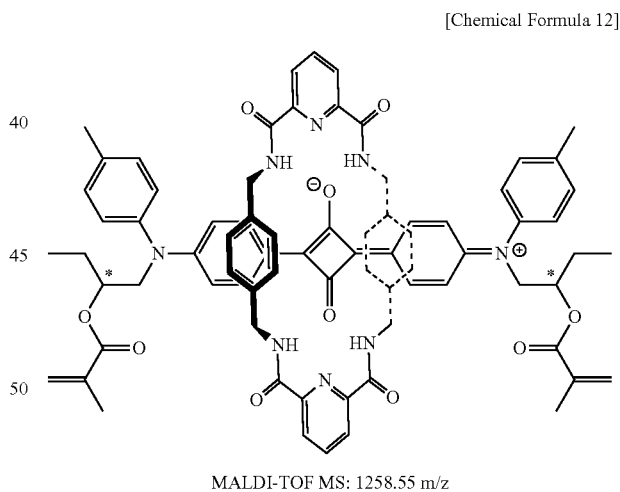

MALDI-TOF MS: 1258.55 m/z

Synthesis Example 33: Synthesis of Core-Shell Dye Represented by Chemical Formula 13

A core-shell dye represented by Chemical Formula 13 was obtained in the same manner as in Synthesis Example 29 except that the compound represented by Chemical Formula 1-3 was used instead of the compound represented by Chemical Formula 1-1.

[Chemical Formula 13]

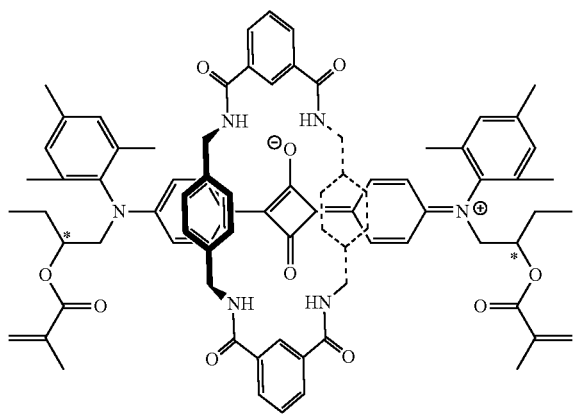

MALDI-TOF MS: 1312.62 m/z

Synthesis Example 34: Synthesis of Core-Shell Dye Represented by Chemical Formula 14

A core-shell dye represented by Chemical Formula 14 was obtained in the same manner as in Synthesis Example 30 except that the compound represented by Chemical Formula 1-3 was used instead of the compound represented by Chemical Formula 1-1.

[Chemical Formula 14]

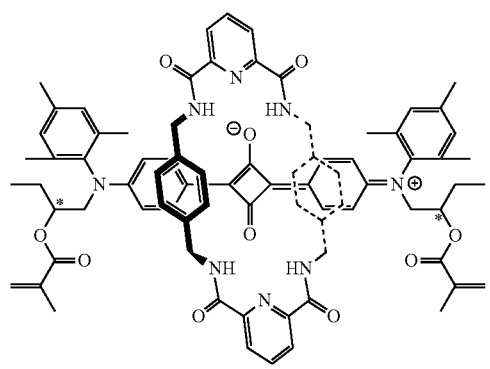

MALDI-TOF MS: 1314.62 m/z

Synthesis Example 35: Synthesis of Core-Shell Dye Represented by Chemical Formula 15

A core-shell dye represented by Chemical Formula 15 was obtained in the same manner as in Synthesis Example 29 except that the compound represented by Chemical Formula 1-4 was used instead of the compound represented by Chemical Formula 1-1.

[Chemical Formula 15]

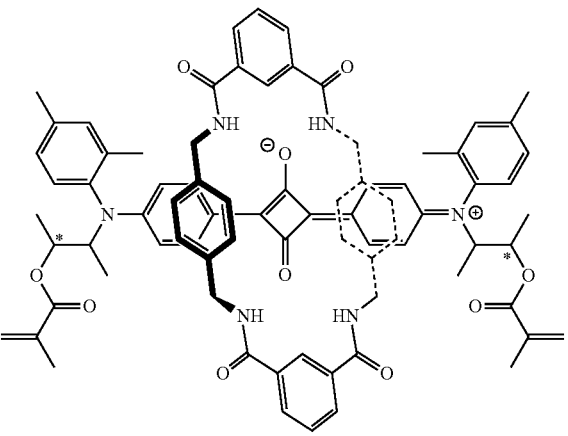

MALDI-TOF MS: 1284.59 m/z

Synthesis Example 36: Synthesis of Core-Shell Dye Represented by Chemical Formula 16

A core-shell dye represented by Chemical Formula 16 was obtained in the same manner as in Synthesis Example 30 except that the compound represented by Chemical Formula 1-4 was used instead of the compound represented by Chemical Formula 1-1.

[Chemical Formula 16]

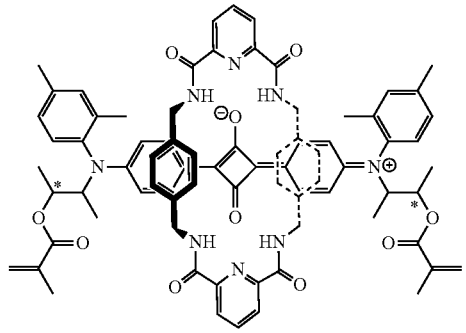

MALDI-TOF MS: 1286.58 m/z

Synthesis Example 37: Synthesis of Core-Shell Dye Represented by Chemical Formula 17

A core-shell dye represented by Chemical Formula 17 was obtained in the same manner as in Synthesis Example 29 except that the compound represented by Chemical Formula 1-5 was used instead of the compound represented by Chemical Formula 1-1.

[Chemical Formula 17]

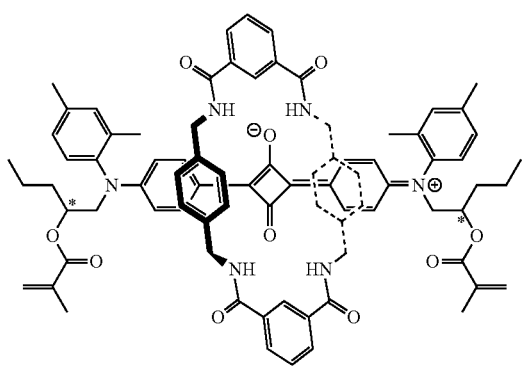

MALDI-TOF MS: 1232.62 m/z

Synthesis Example 38: Synthesis of Core-Shell Dye Represented by Chemical Formula 18

A core-shell dye represented by Chemical Formula 18 was obtained in the same manner as in Synthesis Example 30 except that the compound represented by Chemical Formula 1-5 was used instead of the compound represented by Chemical Formula 1-1.

[Chemical Formula 18]

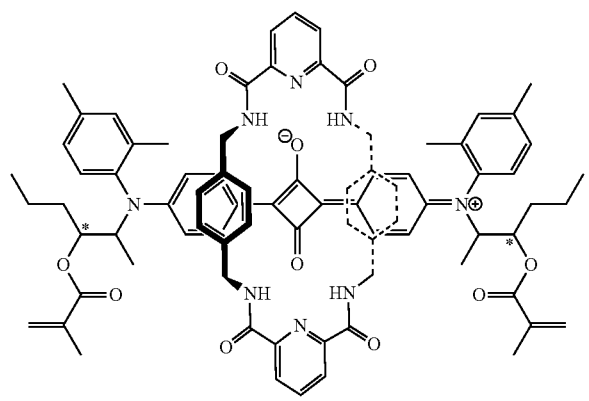

MALDI-TOF MS: 1314.62 m/z

Synthesis Example 39: Synthesis of Core-Shell Dye Represented by Chemical Formula 19

A core-shell dye represented by Chemical Formula 19 was obtained in the same manner as in Synthesis Example 29 except that the compound represented by Chemical Formula 1-6 was used instead of the compound represented by Chemical Formula 1-1.

[Chemical Formula 19]

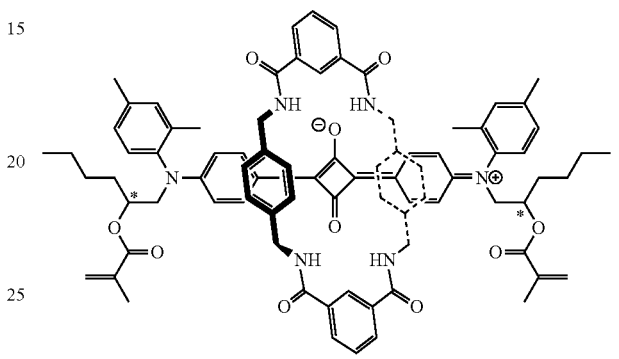

MALDI-TOF MS: 1340.66 m/z

Synthesis Example 40: Synthesis of Core-Shell Dye Represented by Chemical Formula 20

A core-shell dye represented by Chemical Formula 20 was obtained in the same manner as in Synthesis Example 30 except that the compound represented by Chemical Formula 1-6 was used instead of the compound represented by Chemical Formula 1-1.

[Chemical Formula 20]

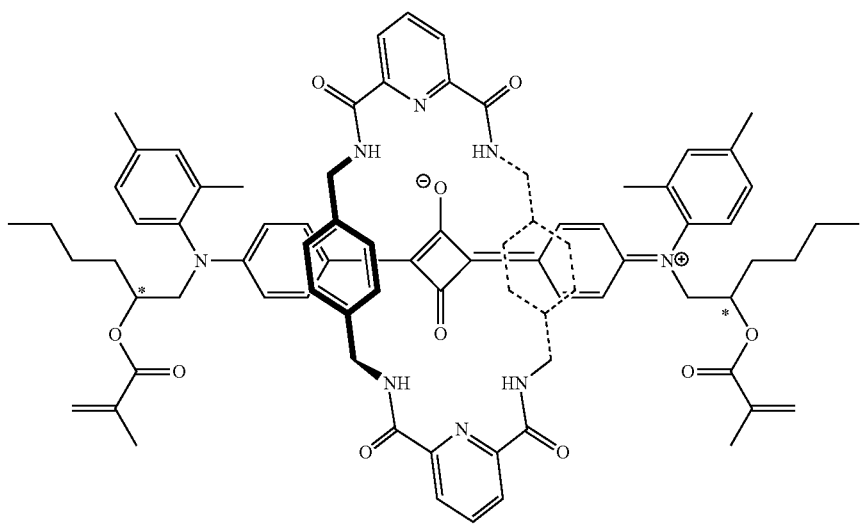

MALDI-TOF MS: 1342.65 m/z

Synthesis Example 41: Synthesis of Core-Shell Dye Represented by Chemical Formula 21

A core-shell dye represented by Chemical Formula 21 was obtained in the same manner as in Synthesis Example 29 except that the compound represented by Chemical Formula 1-7 was used instead of the compound represented by Chemical Formula 1-1.

[Chemical Formula 21]

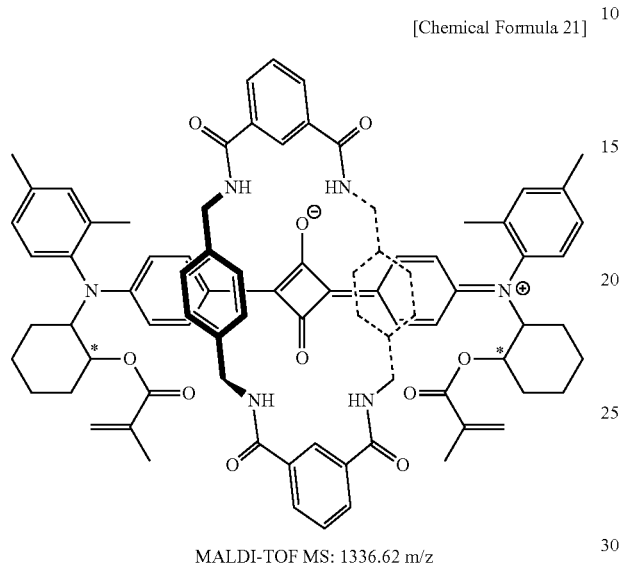

MALDI-TOF MS: 1336.62 m/z

Synthesis Example 42: Synthesis of Core-Shell Dye Represented by Chemical Formula 22

A core-shell dye represented by Chemical Formula 22 was obtained in the same manner as in Synthesis Example 30 except that the compound represented by Chemical Formula 1-7 was used instead of the compound represented by Chemical Formula 1-1.

[Chemical Formula 21]

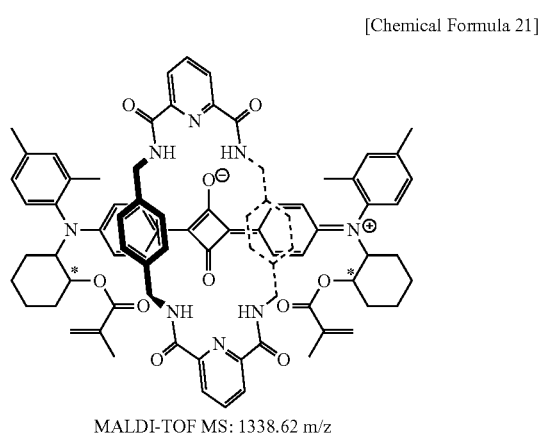

MALDI-TOF MS: 1338.62 m/z

Reference Synthesis Example 3: Synthesis of Core-Shell Dye Represented by Chemical Formula G-1

A core-shell dye represented by Chemical Formula G-1 was obtained in the same manner as in Synthesis Example 29 except that the compound represented by Chemical Formula F-1 was used instead of the compound represented by Chemical Formula 1-1.

[Chemical Formula G-1]

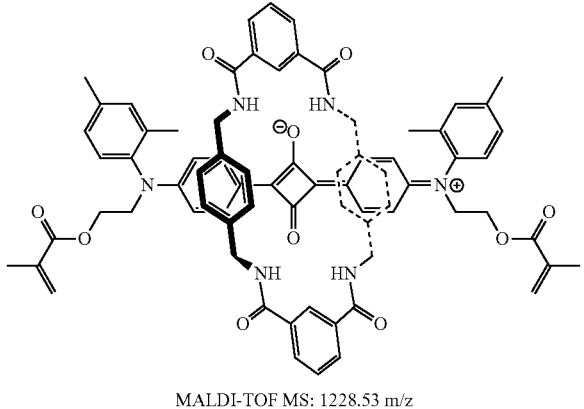

MALDI-TOF MS: 1228.53 m/z

Reference Synthesis Example 4: Synthesis of Core-Shell Dye Represented by Chemical Formula G-2

A core-shell dye represented by Chemical Formula G-2 was obtained in the same manner as in Synthesis Example 30 except that the compound represented by Chemical Formula F-1 was used instead of the compound represented by Chemical Formula 1-1.

[Chemical Formula G-2]

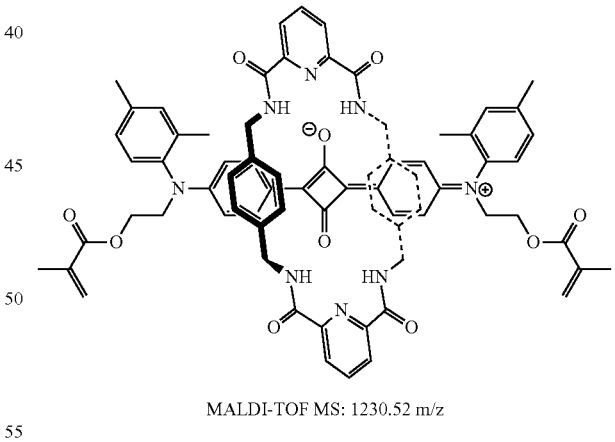

MALDI-TOF MS: 1230.52 m/z

Reference Synthesis Example 5: Synthesis of Core-Shell Dye Represented by Chemical Formula G-3

A core-shell dye represented by Chemical Formula G-3 was obtained in the same manner as in Synthesis Example 29 except that the compound represented by Chemical Formula F-2 was used instead of the compound represented by Chemical Formula 1-1.

[Chemical Formula G-3]

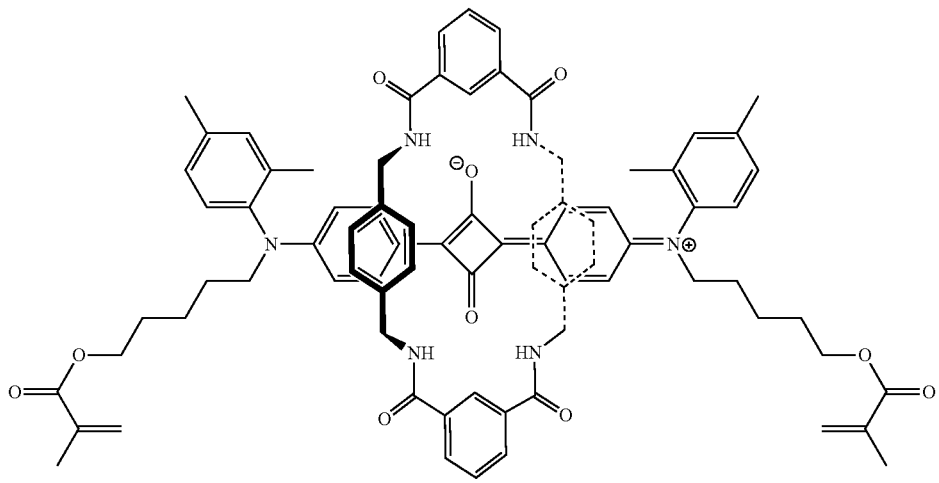

MALDI-TOF MS: 1312.62 m/z

Reference Synthesis Example 6: Synthesis of Core-Shell Dye Represented by Chemical Formula G-4

A core-shell dye represented by Chemical Formula G-4 was obtained in the same manner as in Synthesis Example 30 except that the compound represented by Chemical Formula F-2 was used instead of the compound represented by Chemical Formula 1-1.

[Chemical Formula G-4]

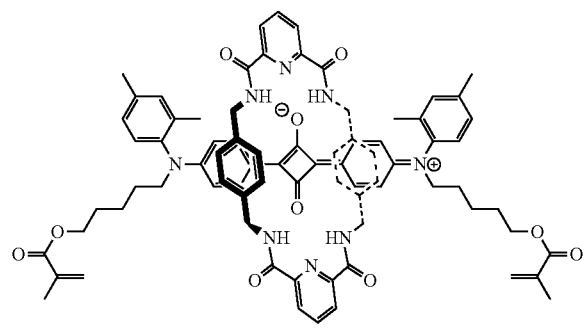

MALDI-TOF MS: 1314.62 m/z (Preparation of Green Dye 2)

Synthesis Example 43: Synthesis of 4-(Biphenyl-2-yloxy)-3,5,6-trichloro-phthalonitrile 5 g of 3,4,5,6-tetrachlorophthalonitrile, 3.21 g of 2-phenylphenol, 3.9 g of $K_2CO_3$, and 25 ml of acetone were put in a 100 ml flask and then, stirred while heated at 70° C. When the reaction was complete, the resultant was filtered and washed with acetone, and a liquid therefrom was distillated to obtain a solid. The obtained solid was dissolved in a small amount of dichloromethane and then, washed several times with hexane, filtered, and vacuum-dried to obtain 4-(biphenyl-2-yloxy)-3,5,6-trichloro-phthalonitrile.

Synthesis Example 44: Synthesis of 3,4,6-Trichloro-5-(2,6-dichloro-phenoxy)-phthalonitrile 5 g of 3,4,5,6-tetrachlorophthalonitrile, 3.06 g of 2,6-dichlorophenol, 3.9 g of $K_2CO_3$, and 25 ml of acetone were put in a 100 ml flask and then, stirred while heated at 70° C. When the reaction was complete, the resultant was filtered and washed with acetone, and a liquid therefrom was distillated to obtain a solid. The obtained solid was dissolved in a small amount of dichloromethane and then, washed several times with hexane, filtered, and vacuum-dried to obtain 3,4,6-trichloro-5-(2,6-dichloro-phenoxy)-phthalonitrile.

Synthesis Example 45: Synthesis of 3,4,6-Trichloro-5-(2,6-dibromo-phenoxy)-phthalonitrile 5 g of 3,4,5,6-tetrachlorophthalonitrile, 4.75 g of 2,6-dibromophenol, 3.9 g of $K_2CO_3$, and 25 ml of N,N-dimethyl formamide were put in a 100 ml flask and stirred while heated at 70° C. When the reaction was complete, the resultant was extracted with EA (ethyl acetate). After the extraction, the resultant was concentrated to obtain a solid. The obtained solid was dissolved in a small amount of dichloromethane and then, washed several times with hexane, filtered, and vacuum-dried to obtain 3,4,6-trichloro-5-(2,6-dibromo-phenoxy)-phthalonitrile.

Synthesis Example 46: Synthesis of 3,4,6-Trichloro-5-(2,6-difluoro-phenoxy)-phthalonitrile 5 g of 3,4,5,6-tetrachlorophthalonitrile, 2.45 g of 2,6-difluorophenol, 3.9 g of $K_2CO_3$, and 25 ml of N,N-dimethyl formamide were put in s 100 ml flask and then, stirred while heated at 70° C. When the reaction was complete, the resultant was extracted with EA (ethyl acetate). After the extraction, the resultant was concentrated to obtain a solid. The obtained solid was dissolved in a small amount of dichloromethane and then, washed several times with hexane, filtered, and vacuum-dried to obtain 3,4,6-trichloro-5-(2,6-difluoro-phenoxy)-phthalonitrile.

Synthesis Example 47: Synthesis of 3,4,6-Trichloro-5-(2-chloro-phenoxy)-phthalonitrile 5 g of 3,4,5,6-tetrachlorophthalonitrile, 2.41 g of 2-chlorophenol, 3.9 g of $K_2CO_3$, and 25 ml of acetone were put in a 100 ml flask and then, stirred while heated at 70° C. When the reaction was complete, the resultant was filtered and washed with acetone, and a liquid therefrom was distillated to obtain a solid. The obtained solid was dissolved in a small amount of dichloromethane and then, washed several times with hexane, filtered, and vacuum-dried to obtain 3,4,6-trichloro-5-(2-chloro-phenoxy)-phthalonitrile.

Synthesis Example 48: Synthesis of 3,4,6-Trichloro-5-(2-bromo-phenoxy)-phthalonitrile 5 g of 3,4,5,6-tetrachlorophthalonitrile, 3.25 g of 2-bromophenol, 3.9 g of $K_2CO_3$, and 25 ml of N,N-dimethyl formamide were put in a 100 ml flask and then, stirred while heated at 70° C. When the reaction was complete, the resultant was extracted with EA (ethyl acetate). After the extraction, the resultant was concentrated to obtain a solid. The obtained solid was dissolved in a small amount of dichloromethane and then, washed several times with hexane, filtered, and vacuum-dried to obtain 3,4,6-trichloro-5-(2-bromo-phenoxy)-phthalonitrile.

Synthesis Example 49: Synthesis of 3,4,6-Trichloro-5-(2-fluoro-phenoxy)-phthalonitrile 5 g of 3,4,5,6-tetrachlorophthalonitrile, 2.10 g of 2-fluorophenol, 3.9 g of $K_2CO_3$, and 25 ml of N,N-dimethyl formamide were put in a 100 ml flask and then, stirred while heated at 70° C. When the reaction was complete, the resultant was extracted with EA (ethyl acetate). After the extraction, the resultant was concentrated to obtain a solid. The obtained solid was dissolved in a small amount of dichloromethane and then, washed several times with hexane, filtered, and vacuum-dried to obtain 3,4,6-trichloro-5-(2-fluoro-phenoxy)-phthalonitrile.

Synthesis Example 50: Synthesis of 3,4,6-Trichloro-5-(2,5-dichloro-phenoxy)-phthalonitrile 5 g of 3,4,5,6-tetrachlorophthalonitrile, 3.06 g of 2,5-dichlorophenol, 3.9 g of $K_2CO_3$, and 25 ml of acetone were put in a 100 ml flask and then, stirred while heated at 70° C. When the reaction was complete, the resultant was filtered and washed with acetone, and a liquid therefrom was distillated to obtain a solid. The obtained solid was dissolved in a small amount of dichloromethane and then, washed several times with hexane, filtered, and vacuum-dried to obtain 3,4,6-trichloro-5-(2,5-dichloro-phenoxy)-phthalonitrile.

Synthesis Example 51: Synthesis of Compound Represented by Chemical Formula 26

1.5 g of 4-(biphenyl-2-yloxy)-3,5,6-trichloro-phthalonitrile of Synthesis Example 42, 0.49 g of 3,4,6-trichloro-5-(2,6-dichloro-phenoxy)-phthalonitrile of Synthesis Example 43, 1.52 g of 1,8-diazabicycloundec-7-ene, and 14 g of 1-pentenol were put in a 100 mL flask and then, heated at 90° C., after the solid was dissolved, 0.23 g of zinc acetate was added thereto, and the mixture was stirred while heated at 140° C. When the reaction was complete, methanol was used for a precipitation, and a precipitate therefrom was filtered and vacuum-dried. The dried solid was purified through column chromatography. Then, dichloromethane was appropriately added to the purified solid to dissolve it, and methanol was added thereto for crystallization. The crystallized solid was filtered and vacuum-dried to obtain a compound represented by Chemical Formula 26.

[Chemical Formula 26]

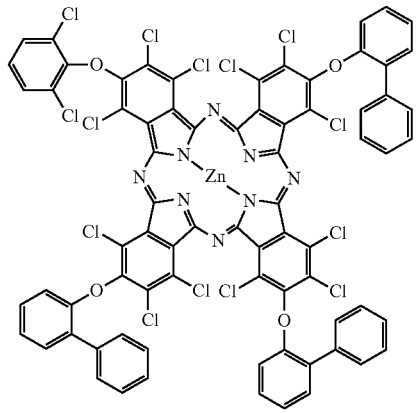

MALDI-TOF MS: 1656.79 m/z

Synthesis Example 52: Synthesis of Compound Represented by Chemical Formula 27

1.6 g of 4-(biphenyl-2-yloxy)-3,5,6-trichloro-phthalonitrile of Synthesis Example 42, 1.5 g of 3,4,6-trichloro-5-(2,6-dichloro-phenoxy)-phthalonitrile of Synthesis Example 43, 1.74 g of 1,8-diazabicycloundec-7-ene, and 14 g of 1-pentenol were put in a 100 mL flask and then, heated at 90° C., after the solid was dissolved, 0.34 g of zinc acetate was added thereto, and the mixture was stirred while heated at 140° C. When the reaction was complete, methanol was used for a precipitation, and a precipitate therefrom was filtered and vacuum-dried. The dried solid was purified through column chromatography. Then, dichloromethane was appropriately added to the purified solid to dissolve it, and methanol was added thereto for crystallization. The crystallized solid was filtered and vacuum-dried to obtain a compound represented by Chemical Formula 27.

[Chemical Formula 27]

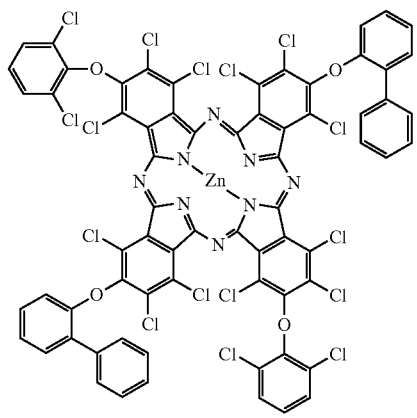

MALDI-TOF MS: 1649.57 m/z

Synthesis Example 53: Synthesis of Compound Represented by Chemical Formula 28

1 g of 4-(biphenyl-2-yloxy)-3,5,6-trichloro-phthalonitrile of Synthesis Example 42, 2.9 g of 3,4,6-trichloro-5-(2,6-dichloro-phenoxy)-phthalonitrile of Synthesis Example 43, 3 g of 1,8-diazabicycloundec-7-ene, and 27 g of 1-pentenol were put in a 100 mL flask and heated at 90° C., after dissolving the solid, 0.45 g of zinc acetate was added thereto, and the mixture was stirred while heated at 140° C. When the reaction was complete, methanol was used for a precipitation, and a precipitate therefrom was filtered and vacuum-dried. The dried solid was purified through column chromatography. Then, dichloromethane was appropriately added to the purified solid to dissolve it, and methanol was added thereto for crystallization. The crystallized solid was filtered and vacuum-dried to obtain a compound represented by Chemical Formula 28.

[Chemical Formula 28]

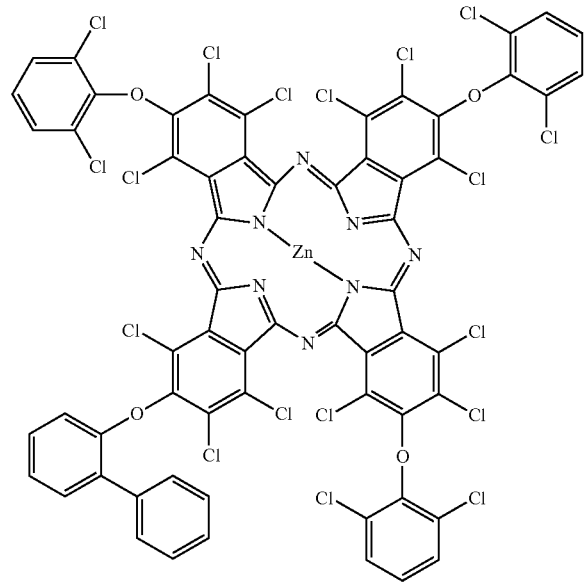

MALDI-TOF MS: 1642.36 m/z

Synthesis Example 54: Synthesis of Compound Represented by Chemical Formula 29

1.5 g of 3,4,6-trichloro-5-(2,6-dichloro-phenoxy)-phthalonitrile of Synthesis Example 43, 0.87 g of 1,8-diazabicycloundec-7-ene, and 7 g of 1-pentenol were put in a 100 mL flask and heated at 90° C., and after the solids were dissolved, 0.17 g of zinc acetate was added thereto, and the mixture stirred while heated at 140° C. When the reaction was complete, methanol was used for a precipitation, and a precipitate therefrom was filtered and vacuum-dried. The dried solid was purified through column chromatography. Then, dichloromethane was appropriately added to the purified solid to dissolve it, and methanol was added thereto for crystallization. The crystallized solid was filtered and vacuum-dried to obtain a compound represented by Chemical Formula 29.

[Chemical Formula 29]

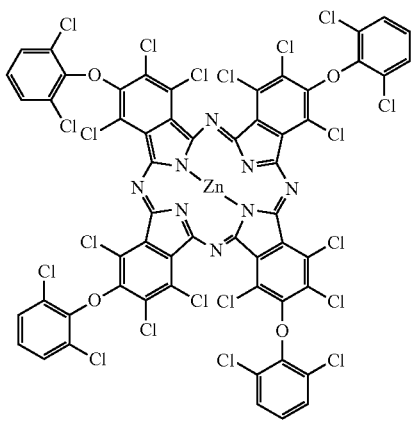

MALDI-TOF MS: 1635.14 m/z

Synthesis Example 55: Synthesis of Compound Represented by Chemical Formula 30

1.5 g of 3,4,6-trichloro-5-(2,6-dibromo-phenoxy)-phthalonitrile of Synthesis Example 44, 0.87 g of 1,8-diazabicycloundec-7-ene, and 7 g of 1-pentenol were put in a 100 mL flask and then, heated at 90° C., after the solid was dissolved, 0.17 g of zinc acetate was added thereto, and the mixture was stirred while heated at 140° C. When the reaction was complete, methanol was used for a precipitation, and a precipitate therefrom was filtered and vacuum-dried. The dried solid was purified through column chromatography. Then, dichloromethane was appropriately added to the purified solid to dissolve it, and methanol was added thereto for crystallization. The crystallized solid was filtered and vacuum-dried to obtain a compound represented by Chemical Formula 30.

[Chemical Formula 30]

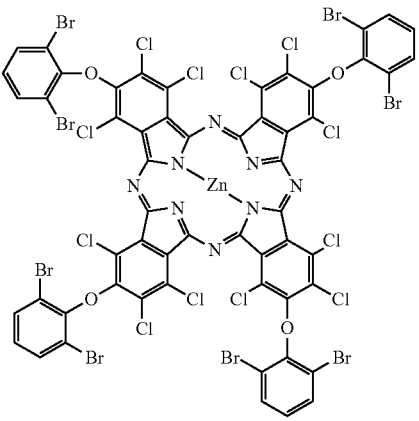

MALDI-TOF MS: 1990.78 m/z

Synthesis Example 56: Synthesis of Compound Represented by Chemical Formula 31

1.5 g of 3,4,6-trichloro-5-(2,6-difluoro-phenoxy)-phthalonitrile of Synthesis Example 45, 0.87 g of 1,8-diazabicycloundec-7-ene, and 7 g of 1-pentenol were put in a 100 mL flask and heated at 90° C., after the solid was dissolved, 0.17 g of zinc acetate was added thereto, and the mixture was stirred while heated at 140° C. When the reaction was complete, methanol was used for a precipitation, and a precipitate therefrom was filtered and vacuum-dried. The dried solid was purified through column chromatography. Then, dichloromethane was appropriately added to the purified solid to dissolve it, and methanol was added thereto for crystallization. The crystallized solid was filtered and vacuum-dried to obtain a compound represented by Chemical Formula 31.

[Chemical Formula 31]

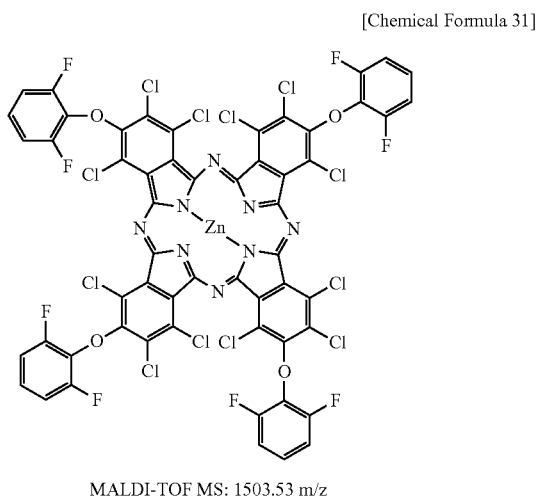

MALDI-TOF MS: 1503.53 m/z

Synthesis Example 57: Synthesis of Compound Represented by Chemical Formula 32

1.5 g of 3,4,6-trichloro-5-(2-chloro-phenoxy)-phthalonitrile of Synthesis Example 46, 0.87 g of 1,8-diazabicycloundec-7-ene, and 7 g of 1-pentenol were put in a 100 mL flask and heated at 90° C., after the solid was dissolved, 0.17 g of zinc acetate was added thereto, and the mixture was stirred while heated at 140° C. When the reaction was complete, methanol was used for a precipitation, and a precipitate therefrom was filtered and vacuum-dried. The dried solid was purified through column chromatography. Then, dichloromethane was appropriately added to the purified solid to dissolve it, and methanol was added thereto for crystallization. The crystallized solid was filtered and vacuum-dried to obtain a compound represented by Chemical Formula 32.

[Chemical Formula 32]

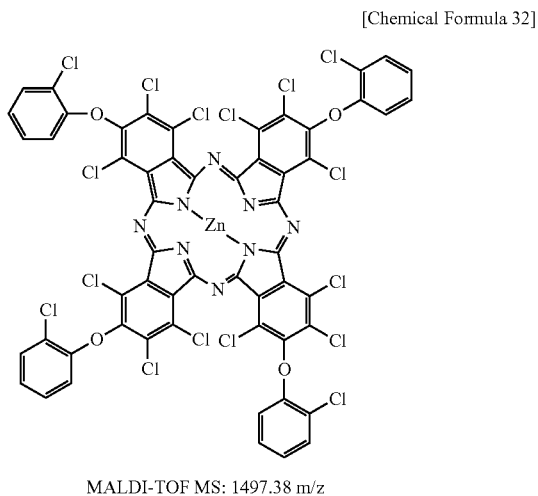

MALDI-TOF MS: 1497.38 m/z

Synthesis Example 58: Synthesis of Compound Represented by Chemical Formula 33

1.5 g of 3,4,6-trichloro-5-(2-bromo-phenoxy)-phthalonitrile of Synthesis Example 47, 0.87 g of 1,8-diazabicycloundec-7-ene, and 7 g of 1-pentenol were put in a 100 mL flask and heated at 90° C., after the solid was dissolved, 0.17 g of zinc acetate was added thereto, and the mixture was stirred while heated at 140° C. When the reaction was complete, methanol was used for a precipitation, and a precipitate therefrom was filtered and vacuum-dried. The dried solid was purified through column chromatography. Then, dichloromethane was appropriately added to the purified solid to dissolve it, and methanol was added thereto for crystallization. The crystallized solid was filtered and vacuum-dried to obtain a compound represented by Chemical Formula 33.

[Chemical Formula 33]

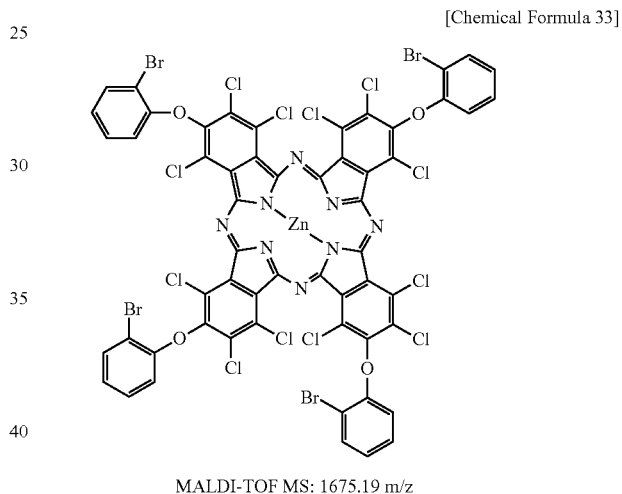

MALDI-TOF MS: 1675.19 m/z

Synthesis Example 59: Synthesis of Compound Represented by Chemical Formula 34

1.5 g of 3,4,6-trichloro-5-(2-fluoro-phenoxy)-phthalonitrile of Synthesis Example 48, 0.87 g of 1,8-diazabicycloundec-7-ene, and 7 g of 1-pentenol were put in a 100 mL flask and heated at 90° C., after dissolving the solid, 0.17 g of zinc acetate was added thereto, and the mixture was stirred while heated at 140° C. When the reaction was complete, methanol was used for a precipitation, and a precipitate therefrom was filtered and vacuum-dried. The dried solid was purified through column chromatography. Then, dichloromethane was appropriately added to the purified solid to dissolve it, and methanol was added thereto for crystallization. The crystallized solid was filtered and vacuum-dried to obtain a compound represented by Chemical Formula 34.

[Chemical Formula 34]

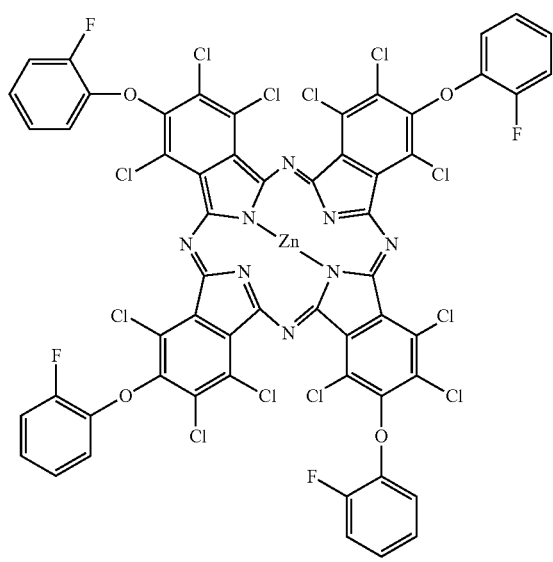

MALDI-TOF MS: 1431.57 m/z

Synthesis Example 60: Synthesis of Compound Represented by Chemical Formula 35

1.6 g of 4-(biphenyl-2-yloxy)-3,5,6-trichloro-phthalonitrile of Synthesis Example 42, 1.5 g of 3,4,6-trichloro-5-(2,5-dichloro-phenoxy)-phthalonitrile of Synthesis Example 49, 1.74 g of 1,8-diazabicycloundec-7-ene, and 14 g of 1-pentenol were put in a 100 mL flask and heated at 90° C., after dissolving the solid, 0.34 g of zinc acetate was added thereto, and the mixture was stirred while heated at 140° C. When the reaction was complete, methanol was used for a precipitation, and a precipitate therefrom was filtered and vacuum-dried. The dried solid was purified through column chromatography. Then, dichloromethane was appropriately added to the purified solid to dissolve it, and methanol was added thereto for crystallization. The crystallized solid was filtered and vacuum-dried to obtain a compound represented by Chemical Formula 35.

[Chemical Formula 35]

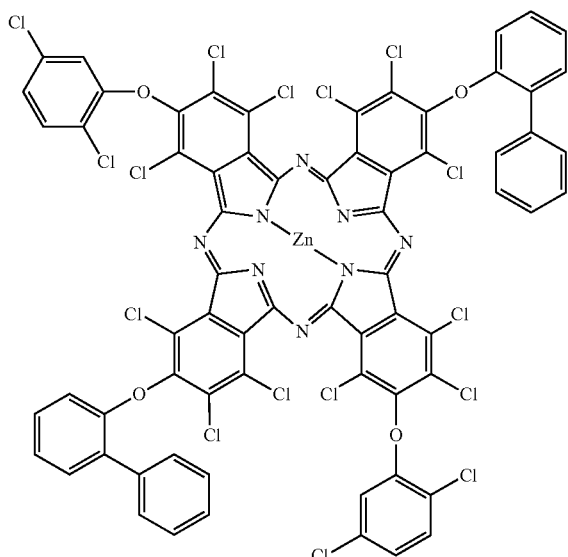

MALDI-TOF MS: 1584.04 m/z (Preparation of Photosensitive Resin Composition)

Photosensitive resin compositions were prepared using the following components.

(A) Colorant (a) Dye (A-a-1) Core-shell dye prepared in Synthesis Example 29 (represented by Chemical Formula 9)

(A-a-2) Core-shell dye prepared in Synthesis Example 42 (represented by Chemical Formula 22)

(A-a-3) Dye prepared in Synthesis Example 51 (represented by Chemical Formula 26)

(A-a-4) Dye prepared in Synthesis Example 60 (represented by Chemical Formula 35)

(A-a-5) Core-shell dye prepared in Reference Synthesis Example 3 (represented by Chemical Formula G-1)

(A-a-6) Core-shell dye prepared in Reference Synthesis Example 4 (represented by Chemical Formula G-2)

(A-a-7) Core-shell dye prepared in Reference Synthesis Example 5 (represented by Chemical Formula G-3)

(A-a-8) Core-shell dye prepared in Reference Synthesis Example 6 (represented by Chemical Formula G-4)

(b) Pigment (A-b-1) C. I. Pigment Green 58 (SANYO)

(A-b-2) C. I. Pigment Yellow 138 (SANYO)

(B) Binder Resin

A methacrylic acid/benzylmethacrylate copolymer having a weight average molecular weight of 22,000 g/mol (a mixing weight ratio: 15 wt %/o/85 wt %)

(C) Photopolymerizable Compound

Dipentaerythritolhexaacrylate (Nippon Kayaku Co. Ltd.)

(D) Photopolymerization Initiator (D-1) 1,2-octandione (TCI)

(D-2) 2-dimethylamino-2-(4-methyl-benzyl)-1-(4-morpholin-4-yl-phenyl)-butan-1-one (TCI)

(E) Solvent (E-1) Cyclohexanone (SIGMA-ALDRICH)

(E-2) Propylene glycol methyletheracetate (SIGMA-ALDRICH)

Examples 1 to 18 and Comparative Examples 1 to 7

Photosensitive resin compositions were prepared by mixing each component in the compositions shown in Table 1 to Table 3. Specifically, a photopolymerization initiator was dissolved in a solvent, the solution was stirred at ambient temperature for 2 hours, a dye (or pigment dispersion liquid) was added thereto, the mixture was stirred for 30 minutes, a binder resin and a photopolymerizable monomer were added thereto, and the obtained mixture was stirred at ambient temperature for 2 hours. The solution was filtered three times to remove impurities and prepare a photosensitive resin composition.

TABLE 1

(unit: wt %)

| | | Examples | | | | | | | | | |
|---|---|---|---|---|---|---|---|---|---|---|---|
| | | 1 | 2 | 3 | 4 | 5 | 6 | 7 | 8 | 9 | 10 |
| (A) Colorant | A-a-1 | 0.5 | 1 | 2 | 2.5 | 3.5 | — | — | — | — | — |
| | A-a-2 | — | — | — | — | — | 0.5 | 1 | 2 | 2.5 | 3.5 |
| | A-a-3 | 4.5 | 4 | 3 | 2.5 | 1.5 | — | — | — | — | — |
| | A-a-4 | — | — | — | — | — | 4.5 | 4 | 3 | 2.5 | 1.5 |
| | A-b-1 | — | — | — | — | — | — | — | — | — | — |
| | A-b-2 | 5 | 5 | 5 | 5 | 5 | 5 | 5 | 5 | 5 | 5 |
| (B) Binder resin | | 3 | 3 | 3 | 3 | 3 | 3 | 3 | 3 | 3 | 3 |
| (C) Photopolymerizable compound | | 4 | 4 | 4 | 4 | 4 | 4 | 4 | 4 | 4 | 4 |
| (D) Photopolymerization initiator | D-1 | 0.5 | 0.5 | 0.5 | 0.5 | 0.5 | 0.5 | 0.5 | 0.5 | 0.5 | 0.5 |
| | D-2 | 0.5 | 0.5 | 0.5 | 0.5 | 0.5 | 0.5 | 0.5 | 0.5 | 0.5 | 0.5 |
| (E) Solvent | E-1 | 40 | 40 | 40 | 40 | 40 | 40 | 40 | 40 | 40 | 40 |
| | E-2 | 42 | 42 | 42 | 42 | 42 | 42 | 42 | 42 | 42 | 42 |
| Total | | 100 | 100 | 100 | 100 | 100 | 100 | 100 | 100 | 100 | 100 |

TABLE 2

(unit: wt %)

| | | Example | | | | | | | |
|---|---|---|---|---|---|---|---|---|---|
| | | 11 | 12 | 13 | 14 | 15 | 16 | 17 | 18 |
| (A) Colorant | A-a-1 | — | — | — | — | — | — | — | — |
| | A-a-2 | — | — | — | — | — | — | — | — |
| | A-a-3 | 2.5 | 2.5 | 2.5 | 2.5 | — | — | — | — |
| | A-a-4 | — | — | — | — | 2.5 | 2.5 | 2.5 | 2.5 |
| | A-a-5 | 2.5 | — | — | — | 2.5 | — | — | — |
| | A-a-6 | — | 2.5 | — | — | — | 2.5 | — | — |
| | A-a-7 | — | — | 2.5 | — | — | — | 2.5 | — |
| | A-a-8 | — | — | — | 2.5 | — | — | — | 2.5 |
| | A-b-1 | — | — | — | — | — | — | — | — |
| | A-b-2 | 5 | 5 | 5 | 5 | 5 | 5 | 5 | 5 |
| (B) Binder resin | | 3 | 3 | 3 | 3 | 3 | 3 | 3 | 3 |
| (C) Photopolymerizable compound | | 4 | 4 | 4 | 4 | 4 | 4 | 4 | 4 |
| (D) Photopolymerization initiator | D-1 | 0.5 | 0.5 | 0.5 | 0.5 | 0.5 | 0.5 | 0.5 | 0.5 |
| | D-2 | 0.5 | 0.5 | 0.5 | 0.5 | 0.5 | 0.5 | 0.5 | 0.5 |
| (E) Solvent | E-1 | 40 | 40 | 40 | 40 | 40 | 40 | 40 | 40 |
| | E-2 | 42 | 42 | 42 | 42 | 42 | 42 | 42 | 42 |
| Total | | 100 | 100 | 100 | 100 | 100 | 100 | 100 | 100 |

TABLE 3

(unit: wt %)

| | | Comparative Example | | | | | | |
|---|---|---|---|---|---|---|---|---|
| | | 1 | 2 | 3 | 4 | 5 | 6 | 7 |
| (A) Colorant | A-a-1 | 5 | — | — | — | — | 4 | — |
| | A-a-2 | — | 5 | — | — | — | — | 4 |
| | A-a-3 | — | — | 5 | — | — | 1 | — |
| | A-a-4 | — | — | — | 5 | — | — | 1 |
| | A-b-1 | — | — | — | — | 5 | — | — |
| | A-b-2 | 5 | 5 | 5 | 5 | 5 | 5 | 5 |
| (B) Binder resin | | 3 | 3 | 3 | 3 | 3 | 3 | 3 |
| (C) Photopolymerizable monomer | | 4 | 4 | 4 | 4 | 4 | 4 | 4 |
| (D) Photopolymerization initiator | D-1 | 0.5 | 0.5 | 0.5 | 0.5 | 0.5 | 0.5 | 0.5 |
| | D-2 | 0.5 | 0.5 | 0.5 | 0.5 | 0.5 | 0.5 | 0.5 |
| (E) Solvent | E-1 | 40 | 40 | 40 | 40 | 40 | 40 | 40 |
| | E-2 | 42 | 42 | 42 | 42 | 42 | 42 | 42 |
| Total | | 100 | 100 | 100 | 100 | 100 | 100 | 100 |

(Evaluation)

Evaluation 1: Evaluation of Luminance and Contrast Ratio

The photosensitive resin compositions according to Example 1 to Example 18 and Comparative Example 1 to Comparative Example 7 were respectively coated to be 1 μm to 3 μm thick on a 1 mm-thick degreased glass substrate and dried on a 90° C. hot plate for 2 minutes to obtain films. Subsequently, the films were exposed to light with a high pressure mercury lamp having a main wavelength of 365 nm and dried in a 230° C. oven for 20 minutes. Luminance and contrast ratios were measured using a spectrophotometer (MCPD3000, Otsuka electronic Co., Ltd.) and the results are shown in Table 4.

TABLE 4

|  | Luminance (%) | Contrast ratio (%) |
| --- | --- | --- |
| Example 1 | 104.0 | 112.0 |
| Example 2 | 104.6 | 120.0 |
| Example 3 | 104.5 | 120.0 |
| Example 4 | 104.0 | 112.0 |
| Example 5 | 104.2 | 115.0 |
| Example 6 | 104.0 | 113.0 |
| Example 7 | 104.7 | 122.0 |
| Example 8 | 104.7 | 122.0 |
| Example 9 | 103.9 | 111.0 |
| Example 10 | 103.9 | 112.0 |
| Example 11 | 103.0 | 105.0 |
| Example 12 | 103.5 | 110.0 |
| Example 13 | 103.6 | 108.0 |
| Example 14 | 103.0 | 105.0 |
| Example 15 | 102.8 | 105.0 |
| Example 16 | 102.8 | 105.0 |
| Example 17 | 103.5 | 108.0 |
| Example 18 | 103.4 | 107.0 |
| Comparative Example 1 | 102.0 | 110.0 |
| Comparative Example 2 | 102.0 | 114.0 |
| Comparative Example 3 | 101.5 | 113.0 |
| Comparative Example 4 | 101.5 | 110.0 |
| Comparative Example 5 | 100.0 | 100.0 |
| Comparative Example 6 | 101.5 | 105.0 |
| Comparative Example 7 | 101.6 | 105.0 |

Referring to Table 4, the photosensitive resin composition according to Examples 1 to 18 (e.g., Examples 1 to 10) included a colorant prepared by mixing two types of green dyes having a predetermined structure in a predetermined weight ratio and exhibited high luminance and a high contrast ratio.

Evaluation 2: Evaluation of Heat Resistance and Chemical Resistance

After dipping a substrate obtained under the same condition as in Evaluation 1 in an NMP (N-methylpyrrolidone) solution at ambient temperature for 10 minutes, transmittance spectra before and after the dipping were obtained and used to calculate ΔEab* according to Equation 1. Heat resistance was evaluated by baking a substrate under the same condition as above at 230° C. for 3 hours to obtain transmittance spectra before and after the baking and calculating ΔEab* according to Equation 1, and the results are shown in Table 5.

$$\Delta Eab^* = \{(\Delta L^*)^2 + (\Delta a^*)^2 + (\Delta b^*)^2\} \times \tfrac{1}{2} \quad \text{[Equation 1]}$$

(The smaller ΔEab* value is, the better the heat resistance and chemical resistance)

TABLE 5

|  | Chemical resistance (ΔEab*) | Heat resistance (ΔEab*) |
| --- | --- | --- |
| Example 1 | 1.9 | 2.0 |
| Example 2 | 0.9 | 1.0 |
| Example 3 | 0.9 | 1.2 |
| Example 4 | 1.8 | 1.6 |
| Example 5 | 1.7 | 1.8 |
| Example 6 | 1.8 | 1.8 |
| Example 7 | 1.2 | 1.0 |
| Example 8 | 1.1 | 1.2 |
| Example 9 | 1.9 | 1.8 |
| Example 10 | 1.6 | 1.7 |
| Example 11 | 2.5 | 2.4 |
| Example 12 | 2.3 | 2.0 |
| Example 13 | 2.2 | 2.1 |
| Example 14 | 2.8 | 2.8 |
| Example 15 | 2.7 | 2.8 |
| Example 16 | 2.9 | 2.8 |
| Example 17 | 2.2 | 2.5 |
| Example 18 | 2.2 | 2.3 |
| Comparative Example 1 | 4.5 | 3.8 |
| Comparative Example 2 | 4.8 | 3.6 |
| Comparative Example 3 | 4.1 | 3.2 |
| Comparative Example 4 | 3.8 | 3.0 |
| Comparative Example 5 | 0.8 | 1.0 |
| Comparative Example 6 | 4.2 | 3.7 |
| Comparative Example 7 | 4.5 | 3.6 |

Referring to Table 5, the photosensitive resin composition according to Examples 1 to 18 (e.g., Examples 1 to 10) included a colorant prepared by mixing two types of green dyes having a predetermined structure in a predetermined weight ratio and exhibited excellent heat resistance and chemical resistance.

By way of summation and review, a pigment dispersion method for forming a color filter may provide a colored thin film by repeating a series of processes such as coating a photopolymerizable composition including a colorant on a transparent substrate including a black matrix, exposing a formed pattern to light, removing a non-exposed part with a solvent, and thermally curing the same. A coloring photosensitive resin composition used for manufacturing a color filter according to the pigment dispersion method may include an alkali soluble (e.g., binder) resin, a photopolymerizable monomer, a photopolymerization initiator, an epoxy resin, a solvent, other additives, and the like. The pigment dispersion method may be applied to manufacture an LCD of a mobile phone, a laptop, a monitor, and TV. A photosensitive resin composition for a color filter for the pigment dispersion method may exhibit improved performance as well as excellent pattern characteristics. For example, high color reproducibility and high luminance and high contrast ratio characteristics may be desirable.

An image sensor is a part for photographing images in a portable phone camera or DSC (a digital still camera). It may be classified as a charge-coupled device (CCD) image sensor and a complementary metal oxide semiconductor (CMOS) image sensor depending upon the manufacturing process and the application method. A color imaging device for a charge-coupled device image sensor or a complementary metal oxide semiconductor image sensor may include color filters each having filter segments of mixing primary color of red, green, and blue, and the colors are separated. A color filter mounted in the color imaging device may have a pattern size of 2 μm or less, which is 1/100th to 1/200th of the pattern size of a color filter pattern for LCDs. For example, increased resolution and decreased pattern residues may be factors for determining the performance of a device.

A color filter manufactured by using a pigment photosensitive resin composition may have a limit in luminance and a contrast ratio due to the size of pigment particles. In addition, a color imaging device for an image sensor may use a smaller dispersion particle diameter for forming a fine pattern. A color filter having improved luminance and a contrast ratio may be realized by introducing a dye (that does not form a particle) instead of the pigment to prepare a photosensitive resin composition appropriate for the dye. Some dyes may have inferior durability such as light resistance, heat resistance, and the like, when compared to a pigment, and luminance could be deteriorated.

One or more embodiments may provide a photosensitive resin composition having improved heat resistance and chemical resistance while maintaining a high transmittance, high luminance, and high contrast ratio characteristics compared with a pigment photosensitive resin composition.

The photosensitive resin composition according to an embodiment may be used to prepare a color filter having improved luminance, contrast ratio, heat resistance, and chemical resistance by using a colorant in which two different green dyes are mixed in a specific weight ratio.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photosensitive resin composition, comprising:
   a colorant that includes:
      a first green dye having a core-shell structure in which the core is represented by Chemical Formula 1, and
      a second green dye represented by Chemical Formula 2, a weight ratio of the first green dye to the second green dye in the colorant being about 1:9 to about 7:3;
   a binder resin;
   a photopolymerizable compound;
   a photopolymerization initiator; and
   a solvent,

[Chemical Formula 1]

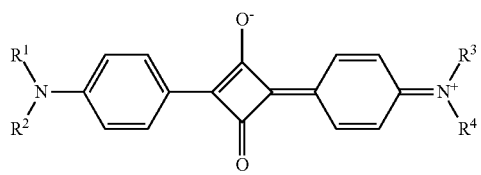

[Chemical Formula 2]

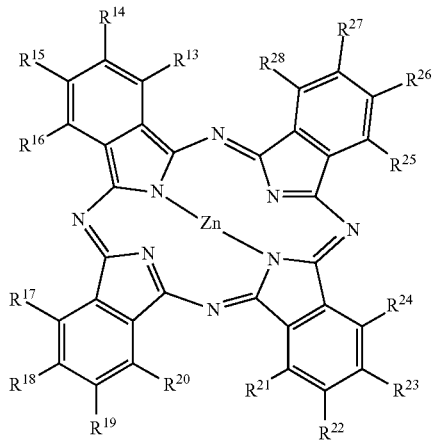

wherein, in Chemical Formula 1 and Chemical Formula 2,
$R^1$ to $R^4$ are each independently a substituted or unsubstituted C1 to C20 alkyl group, a substituted or unsubstituted C3 to C20 cycloalkyl group, or a substituted or unsubstituted C6 to C20 aryl group, provided that at least one of $R^1$ to $R^4$ is a substituted C1 to C20 alkyl group, a substituted C3 to C20 cycloalkyl group, or a substituted C6 to C20 aryl group that is substituted with a substituted or unsubstituted acrylate group, and
$R^{13}$ to $R^{28}$ are each independently a hydrogen atom, a halogen atom, a substituted or unsubstituted C1 to C20 alkyl group, a substituted or unsubstituted C3 to C20 alkoxy group, a substituted or unsubstituted C6 to C20 aryl group, or a substituted or unsubstituted C6 to C20 aryloxy group.

2. The photosensitive resin composition as claimed in claim 1, wherein the weight ratio of the first green dye to the second green dye in the colorant is about 2:8 to about 5:5.

3. The photosensitive resin composition as claimed in claim 1, wherein at least one of $R^1$ to $R^4$ is represented by Chemical Formula 3:

[Chemical Formula 3]

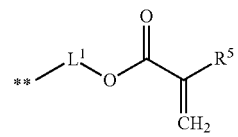

wherein, in Chemical Formula 3,
$R^5$ is a hydrogen atom or a substituted or unsubstituted C1 to C10 alkyl group,
** is a binding site, and
$L^1$ is a group represented by Chemical Formula 3-1 or Chemical Formula 3-2,

[Chemical Formula 3-1]

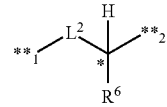

-continued

[Chemical Formula 3-2]

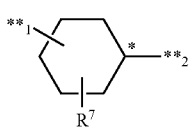

wherein, in Chemical Formula 3-1 and Chemical Formula 3-2,
$L^2$ is a single bond or a substituted or unsubstituted C1 to C10 alkylene group,
$R^6$ is a substituted or unsubstituted C1 to C10 alkyl group,
$R^7$ is a hydrogen atom or a substituted or unsubstituted C1 to C10 alkyl group,
* indicates a chiral carbon,
1 indicates a linking point with  of Chemical Formula 3, and
**2 indicates a linking point with the oxygen atom of the ether group of Chemical Formula 3.

4. The photosensitive resin composition as claimed in claim 1, wherein $R^1$ and $R^3$ are each independently a group represented by one of Chemical Formula 6-1 to Chemical Formula 6-3:

[Chemical Formula 6-1]

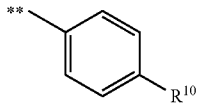

[Chemical Formula 6-2]

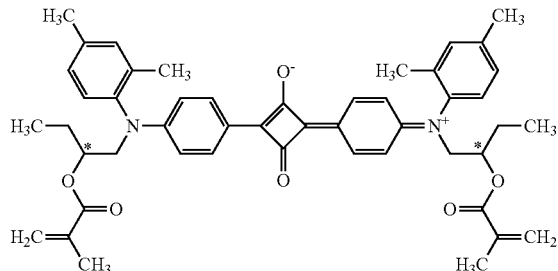

[Chemical Formula 6-3]

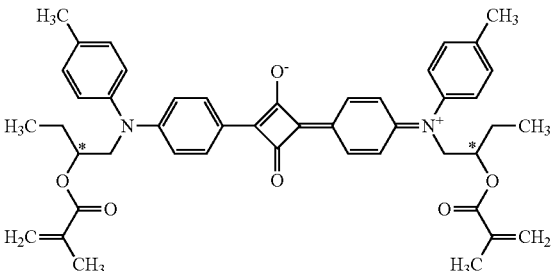

wherein, in Chemical Formula 6-1 to Chemical Formula 6-3,
$R^{10}$ to $R^{12}$ are each independently an unsubstituted C1 to C10 alkyl group, and
** represents a binding site.

5. The photosensitive resin composition as claimed in claim 1, wherein the core represented by Chemical Formula 1 is represented by one of Chemical Formula 1-1 to Chemical Formula 1-7, in which * indicates a chiral carbon:

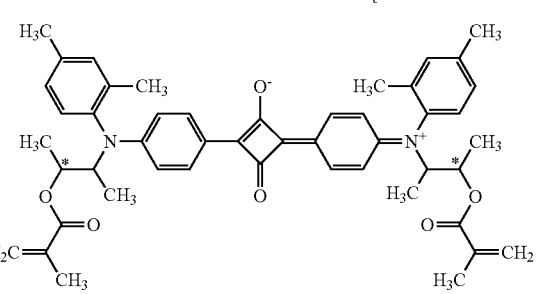

-continued

[Chemical Formula 1-6]

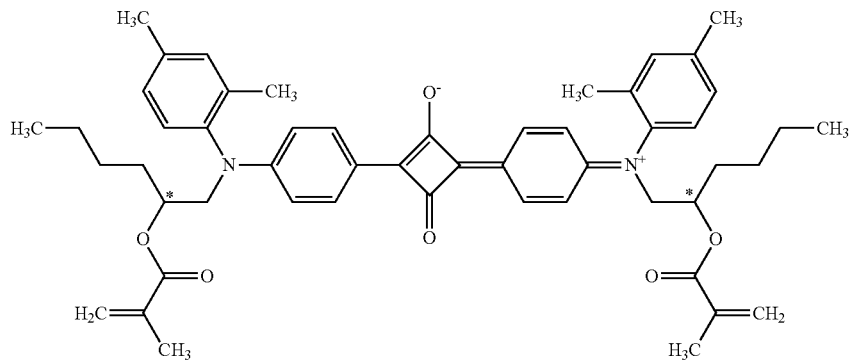

[Chemical Formula 1-7]

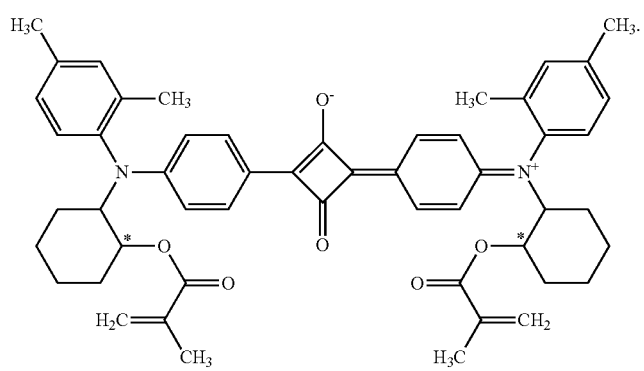

6. The photosensitive resin composition as claimed in claim 1, wherein the shell of the core-shell structure is represented by Chemical Formula 7 or Chemical Formula 8:

[Chemical Formula 7]

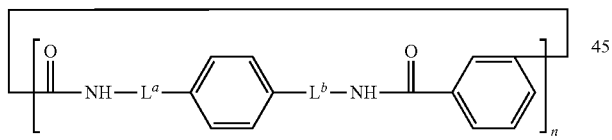

[Chemical Formula 8]

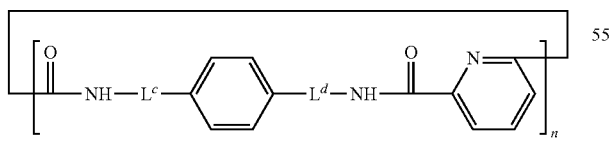

wherein, in Chemical Formula 7 and Chemical Formula 8, $L^a$ to $L^d$ are each independently a single bond or a substituted or unsubstituted C1 to C10 alkylene group, and n is an integer of 2 to 10.

7. The photosensitive resin composition as claimed in claim 6, wherein the shell of the core-shell structure is represented by Chemical Formula 7-1 or Chemical Formula 8-1:

[Chemical Formula 7-1]

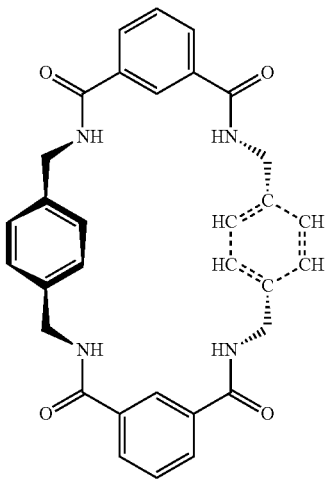

[Chemical Formula 8-1]
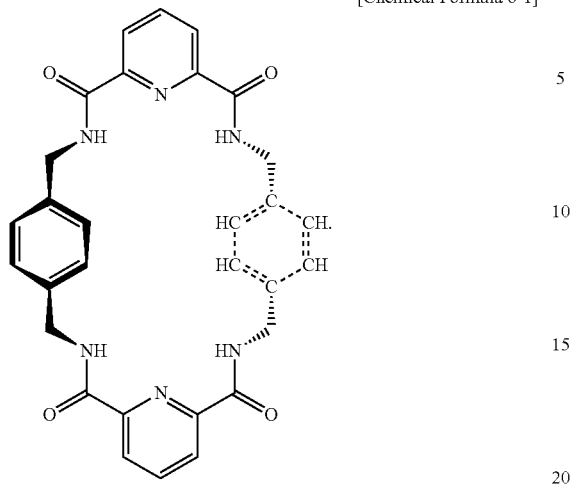
8. The photosensitive resin composition as claimed in claim 1, wherein the first green dye having the core-shell structure is represented by one of Chemical Formula 9 to Chemical Formula 22:
[Chemical Formula 9]
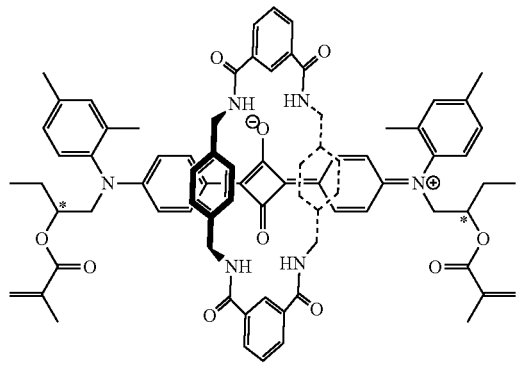
[Chemical Formula 10]
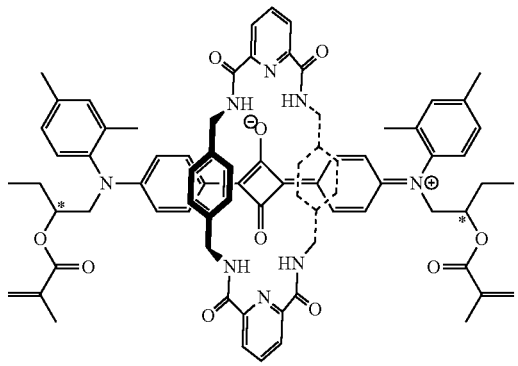
[Chemical Formula 11]
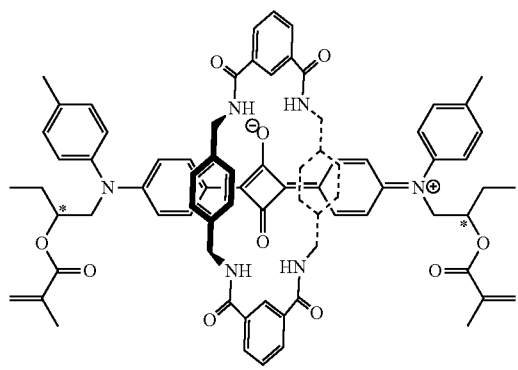
[Chemical Formula 12]
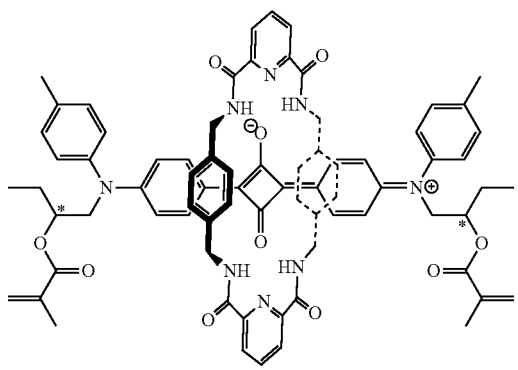

79 80
-continued
[Chemical Formula 13]
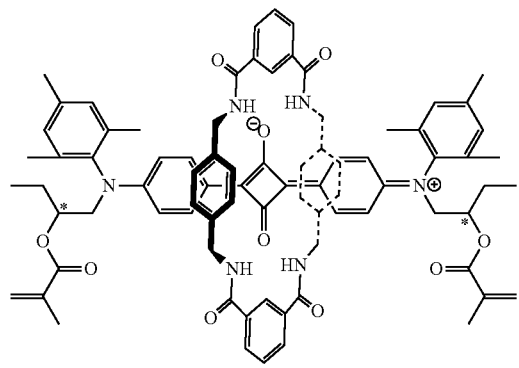
[Chemical Formula 14]
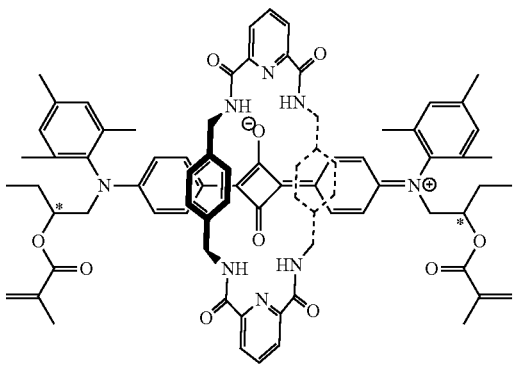
[Chemical Formula 15]
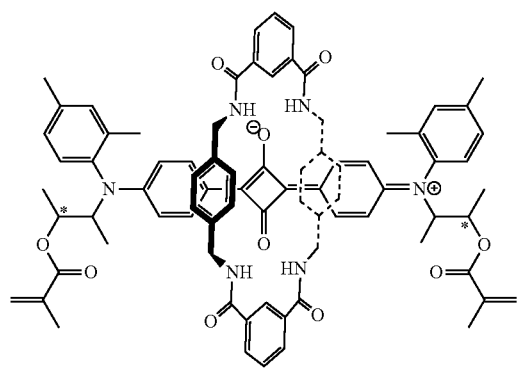
[Chemical Formula 16]
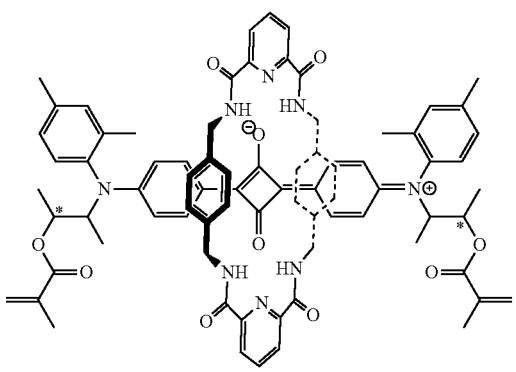
[Chemical Formula 17]
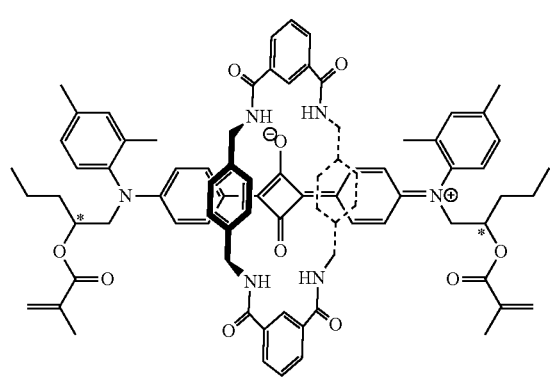
[Chemical Formula 18]
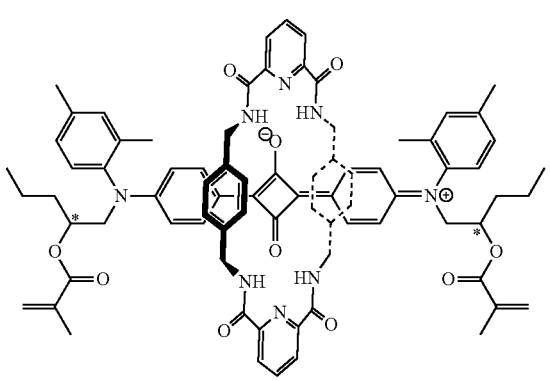
[Chemical Formula 19]
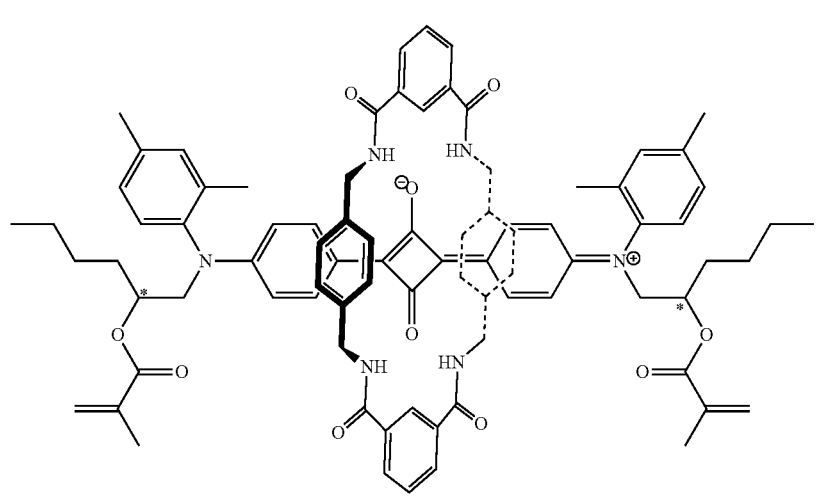

-continued

[Chemical Formula 20]

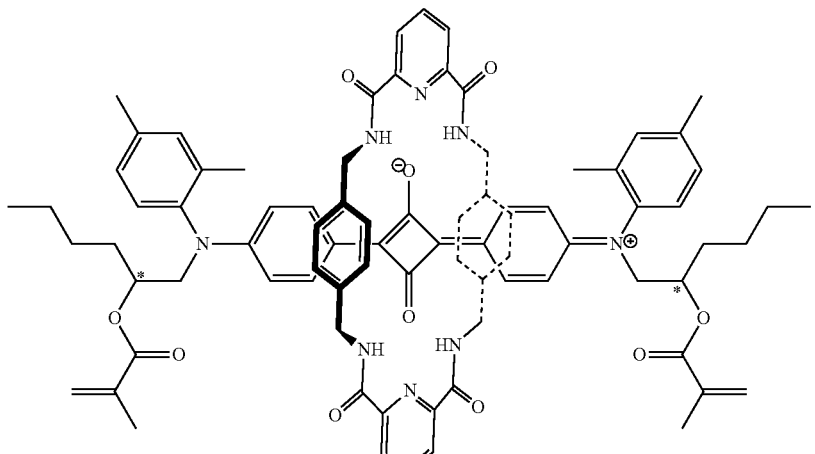

[Chemical Formula 21]

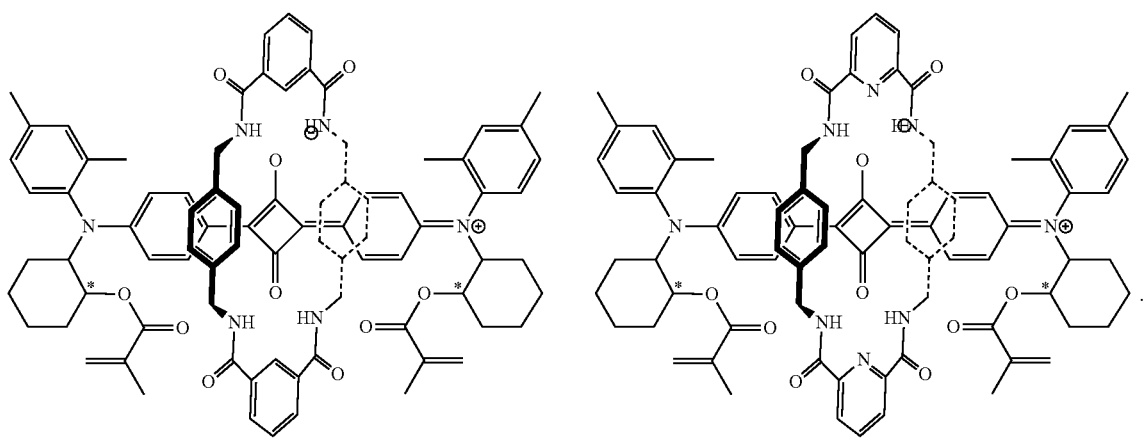

[Chemical Formula 22]

9. The photosensitive resin composition as claimed in claim 1, wherein the core and the shell are included in the core-shell structure in a mole ratio of about 1:1.

10. The photosensitive resin composition as claimed in claim 1, wherein in Chemical Formula 2, at least one of $R^{13}$ to $R^{28}$ is a group represented by Chemical Formula 23:

[Chemical Formula 23]

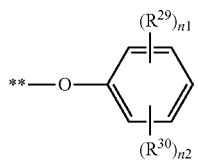

wherein, in Chemical Formula 23, $R^{29}$ and $R^{30}$ are each independently a halogen atom, n1 and n2 are each independently an integer of 0 to 5, provided that $1 \le n1+n2 \le 5$, and

** represents a binding site.

11. The photosensitive resin composition as claimed in claim 10, wherein the group represented by Chemical Formula 23 is represented by one of Chemical Formula 24-1 to Chemical Formula 24-4:

[Chemical Formula 24-1]

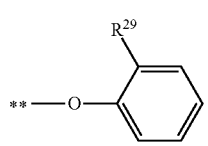

[Chemical Formula 24-2]

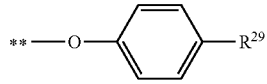

[Chemical Formula 24-3]

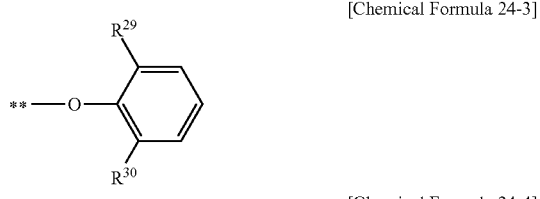

[Chemical Formula 24-4]

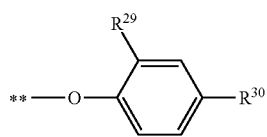

wherein, in Chemical Formula 24-1 to Chemical Formula 24-4, $R^{29}$ and $R^{30}$ are each independently a halogen atom, and

** represents a binding site.

12. The photosensitive resin composition as claimed in claim 10, wherein at least one other one of $R^{13}$ to $R^{28}$ is a group represented by Chemical Formula 25, in which ** represents a binding site,

[Chemical Formula 25]

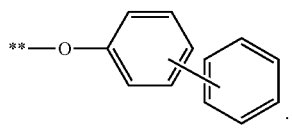

13. The photosensitive resin composition as claimed in claim 1, wherein the second green dye represented by Chemical Formula 2 is represented by one of Chemical Formula 26 to Chemical Formula 35:

[Chemical Formula 26]

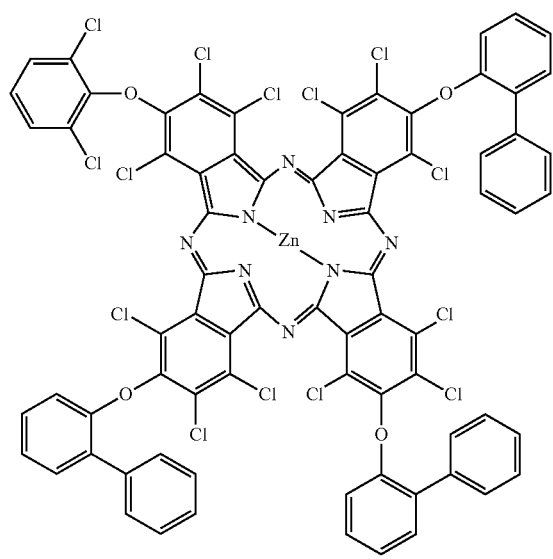

[Chemical Formula 27]

[Chemical Formula 28]

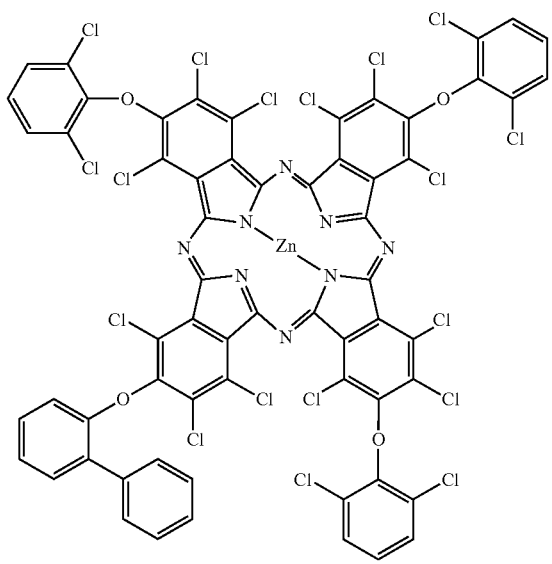

[Chemical Formula 29]

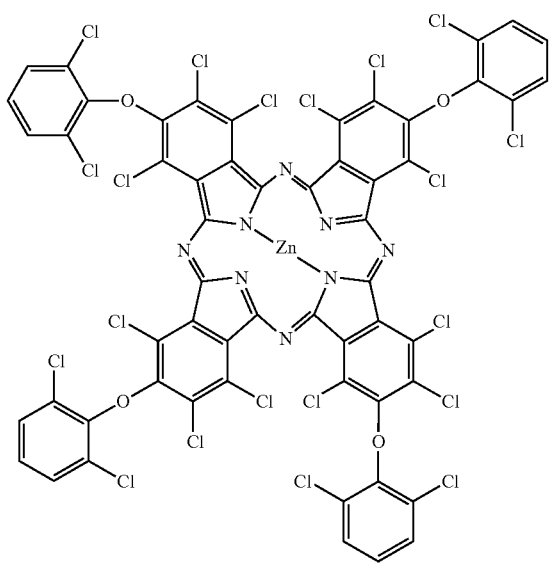

[Chemical Formula 30]
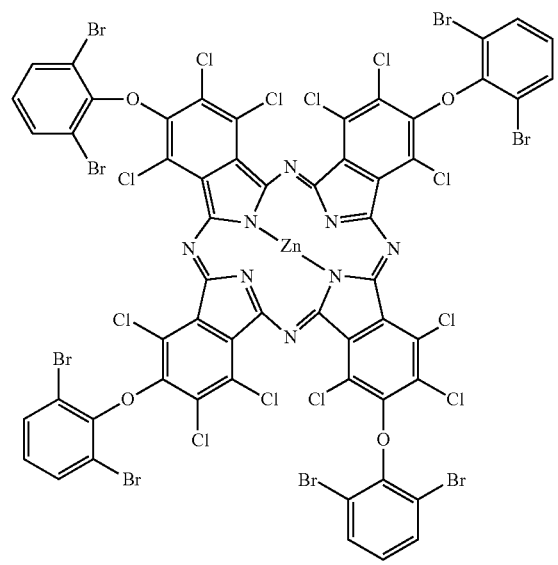
[Chemical Formula 32]
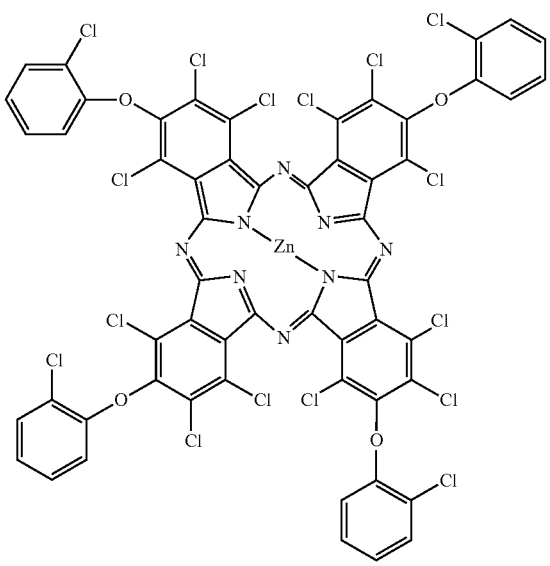
[Chemical Formula 31]
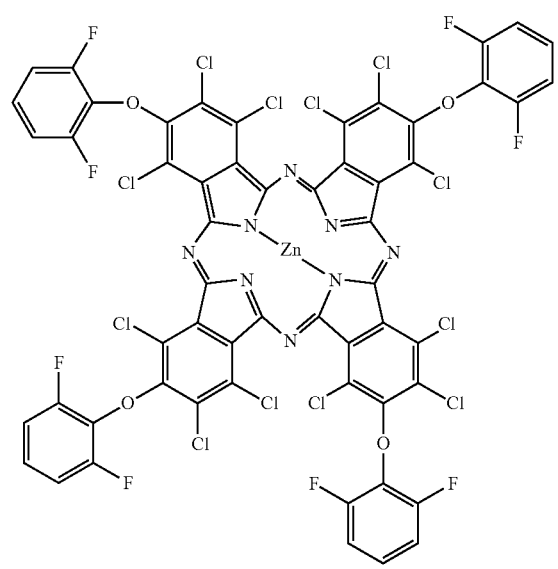
[Chemical Formula 33]
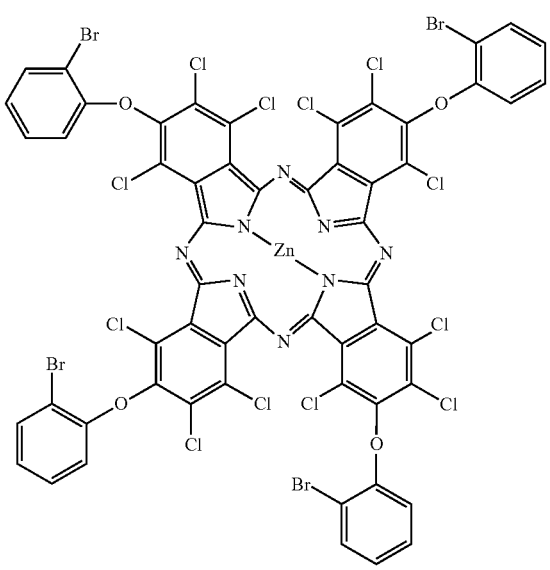

[Chemical Formula 34]

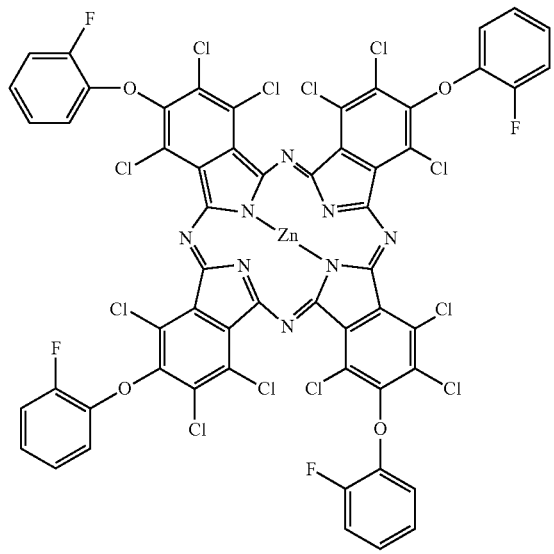

[Chemical Formula 35]

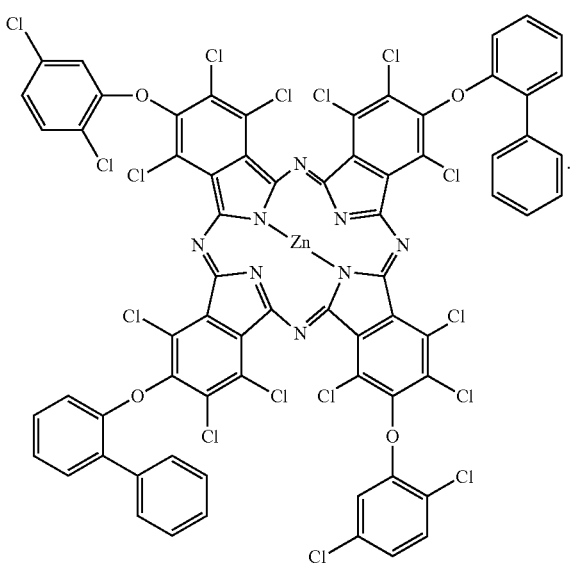

14. The photosensitive resin composition as claimed in claim 1, wherein the second green dye represented by Chemical Formula 2 has a wavelength of peak transmittance of about 445 nm to about 560 nm.

15. The photosensitive resin composition as claimed in claim 1, wherein the photosensitive resin composition includes:
    about 1 wt % to about 30 wt % of the colorant;
    about 0.1 wt % to about 20 wt % of the binder resin;
    about 0.1 wt % to about 30 wt % of the photopolymerizable compound;
    about 0.1 wt % to about 5 wt % of the photopolymerization initiator; and
    the solvent,
    based on a total weight of the photosensitive resin composition.

16. The photosensitive resin composition as claimed in claim 1, further comprising malonic acid, 3-amino-1,2-propanediol, a silane coupling agent that includes a vinyl group or a (meth)acryloxy group, a leveling agent, a surfactant, a radical polymerization initiator, or a combination thereof.

17. The photosensitive resin composition as claimed in claim 1, wherein:
    the at least one of $R^1$ to $R^4$ includes a chiral carbon, and
    the substituted or unsubstituted acrylate group is directly bonded to the chiral carbon.

18. A photosensitive resin layer manufactured using the photosensitive resin composition as claimed in claim 1.

19. A color filter comprising the photosensitive resin layer as claimed in claim 18.

* * * * *